(12) United States Patent
Maya et al.

(10) Patent No.: US 7,256,653 B2
(45) Date of Patent: Aug. 14, 2007

(54) HIGH-FREQUENCY POWER AMPLIFIER AND COMMUNICATION APPARATUS

(75) Inventors: Oki Maya, Setagaya (JP); Kazuki Tateoka, Takatsuki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 94 days.

(21) Appl. No.: 11/076,525

(22) Filed: Mar. 10, 2005

(65) Prior Publication Data
US 2005/0208909 A1    Sep. 22, 2005

(30) Foreign Application Priority Data
Mar. 19, 2004   (JP)   ............... 2004-080390

(51) Int. Cl.
*H03F 3/04* (2006.01)
(52) U.S. Cl. .................................... 330/289
(58) Field of Classification Search ............... 330/285, 330/289
See application file for complete search history.

(56) References Cited

U.S. PATENT DOCUMENTS

| | | | |
|---|---|---|---|
| 6,566,944 B1 * | 5/2003 | Pehlke et al. | 330/10 |
| 6,665,525 B2 * | 12/2003 | Dent et al. | 455/108 |
| 6,701,138 B2 | 3/2004 | Epperson et al. | |
| 6,753,735 B2 * | 6/2004 | Arai et al. | 330/297 |
| 6,897,730 B2 * | 5/2005 | Dupuis et al. | 330/297 |
| 6,917,243 B2 * | 7/2005 | Doherty et al. | 330/133 |

FOREIGN PATENT DOCUMENTS

| | | |
|---|---|---|
| JP | 08-028617 B2 | 1/1991 |
| JP | 2001-176982 | 6/2001 |
| JP | 2002-009558 | 1/2002 |
| WO | WO 02/101944 A | 12/2002 |

\* cited by examiner

*Primary Examiner*—Robert Pascal
*Assistant Examiner*—Hieu Nguyen
(74) *Attorney, Agent, or Firm*—McDermott Will & Emery LLP

(57) ABSTRACT

A temperature compensation circuit 145 included in a collector voltage generation section 130a applies an offset voltage Vofs(T) to a power control signal Vctrl according to a device temperature. The resulting temperature compensation circuit output voltage Vctrl' (T) is applied to a collector terminal of a bipolar transistor 110 through a voltage regulator 140 and a choke inductor 170.

9 Claims, 18 Drawing Sheets

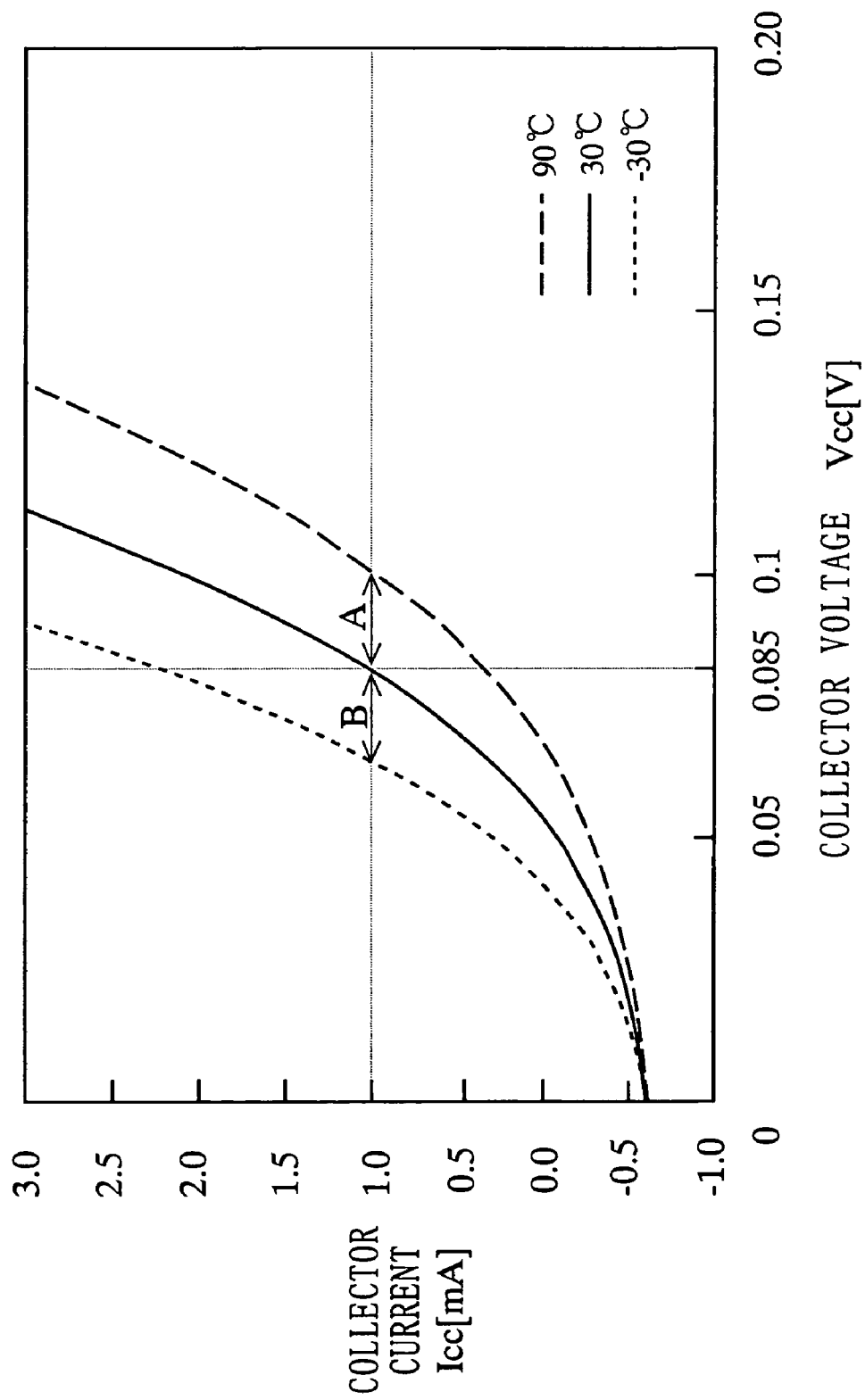
F I G. 6

10

HIGH-FREQUENCY POWER AMPLIFIER AND COMMUNICATION APPARATUS

BACKGROUND OF THE INVENTION

1. Field of the Invention

The present invention relates to a high-frequency power amplifier for use in mobile communication devices and the like, and a communication apparatus having such a high-frequency power amplifier.

2. Description of the Background Art

A high-frequency power amplifier for use in mobile phone terminals of GSM (Global System for Mobile Communications) system and the like, controls the magnitude of the output power based on the distance thereof from the base station. FIG. 17 is a circuit diagram illustrating a high-frequency power amplifier 10 (hereinafter referred to as the "amplifier 10") which is an exemplary conventional high-frequency power amplifier. The amplifier 10 includes a bipolar transistor 11, a base bias circuit 12, a voltage regulator 14, an RF choke inductor 17, an input matching circuit 15, and an output matching circuit 16.

The RF choke inductor 17 and the voltage regulator 14 are sequentially connected in this order to a collector terminal of the bipolar transistor 11. A power control signal Vctrl for adjusting the signal amplification level of the bipolar transistor 11 is inputted to the voltage regulator 14. An emitter terminal of the bipolar transistor 11 is grounded. A high-frequency input signal RFin is inputted to a base terminal of the bipolar transistor 11 through the input matching circuit 15. The base bias circuit 12 adjusts the magnitude of a base voltage Vbb. The high-frequency input signal RFin is amplified by the bipolar transistor 11 and then outputted as a high-frequency output signal RFout from the collector terminal of the bipolar transistor 11 through the output matching circuit 16.

In the case where the input power to the base terminal is sufficiently high and the bipolar transistor 11 operates as a saturation amplifier, an output power proportional to almost the square of collector voltage Vcc can be obtained with respect to a given input power. Note that although, for simplification, FIG. 17 shows a single-stage amplifier 10, normally, an amplifier 10 in which bipolar transistors 11 are cascade-connected in two or three stages is used.

In communication systems such as EDGE (Enhanced Data Rate for GSM Evolution), a technique called a polar modulation is used. In this case, as a power control signal Vctrl, an amplitude modulation signal is inputted to the collector terminal, and thereby amplitude modulation is performed, which is described in International Publication No. WO-02/101944, for example.

The output power of the amplifier 10 changes with the device temperature of the bipolar transistor 11 even if the collector voltage Vcc and the base voltage Vbb are constant. Therefore, conventionally, by adjusting the base voltage Vbb in the base bias circuit 12 based on the temperature, temperature-dependent variations in output power are minimized, which is described in, for example, Japanese Examined Patent Publication No. 8-28617 and Japanese Laid-Open Patent Publications No. 2001-176982 and No. 2002-9558.

However, even if temperature compensation is thus performed on the base voltage Vbb, in the case of low output where the collector voltage Vcc is low, more specifically, in the case where the bipolar transistor is used in a saturation region, output voltage fluctuations caused by changes in temperature cannot be sufficiently minimized. FIG. 18 is a diagram showing the relationship between the collector voltage Vcc and the output power of a conventional high-frequency power amplifier for the GSM system for the case where the device temperature is 90° C., 30° C., and −30° C. It can be seen from FIG. 18 that in the region where the collector voltage Vcc is less than 0.6 V, the lower the collector voltage Vcc, the greater the change in output power with the temperature.

A high-frequency power amplifier for use in GSM system mobile phones is used in a region where the output power ranges from 5 to 35 dBm shown in FIG. 18. That is, the high-frequency power amplifier is used also in a region where the output power variations with the temperature are great. In EDGE system mobile phones, the amplitude modulation signal to be inputted to the collector terminal is used in a region where the output power ranges from −8 to 32 dBm shown in FIG. 18. That is, the EDGE system mobile phone is used in a region where the output power variations with the temperature are more significant than that of the GSM system mobile phone. In addition, in the EDGE system using polar modulation, an amplitude error is directly related to degradation of modulation accuracy, and therefore, the EDGE system requires better output stability than the GSM system. The polar modulation is a technique which can be applied also to a W-CDMA (Wideband CDMA) system in the future. The W-CDMA system needs to be controlled at a lower output power than that for the EDGE system. Therefore, a technique is demanded for minimizing output power fluctuations caused by changes in temperature, at low output power where the bipolar transistor needs to be controlled in the saturation region.

SUMMARY OF THE INVENTION

Therefore, an object of the present invention is to provide a high-frequency power amplifier capable of minimizing output power variations with temperature even when the output power is low.

A high-frequency power amplifier according to the present invention is capable of minimizing a temperature dependence of an output power even in a saturation region of a bipolar transistor, the amplifier comprising: a bipolar transistor; a base bias circuit for applying a base voltage to the bipolar transistor; and a collector voltage generation section for applying a collector voltage to the bipolar transistor, wherein the collector voltage generation section includes a temperature compensation circuit for performing temperature compensation on a power control signal to be inputted.

The collector voltage generation section may apply, as a collector offset voltage, a voltage having a difference between a reference collector voltage at which a desired collector current is obtained at a reference temperature and a collector voltage required to obtain the desired collector current at actual temperature, to the reference collector voltage.

The temperature compensation circuit may include: a temperature compensation voltage source; and an adder for adding an offset voltage to be outputted from the temperature compensation voltage source to the power control signal.

The temperature compensation circuit may include: a temperature compensation voltage source; and a subtractor for subtracting an offset voltage to be outputted from the temperature compensation voltage source from the power control signal.

The collector voltage generation section may include a voltage regulator.

The collector voltage generation section may include a DC/DC converter.

The collector voltage generation section may include: an operational amplifier; and a P-type field-effect transistor or a PNP bipolar transistor.

The power control signal may be an amplitude modulation signal.

There may be a plurality of the bipolar transistors, and the plurality of the bipolar transistors may be connected in multiple stages.

A communication apparatus according to the present invention comprises: a baseband circuit; a converter for converting an output signal of the baseband circuit into an amplitude modulation signal and a phase modulation signal; a collector voltage generation section including a temperature compensation circuit for performing temperature compensation on the amplitude modulation signal; a voltage controlled oscillator for controlling an oscillatory frequency based on the phase modulation signal; a bipolar transistor having a collector terminal and a base terminal, an output voltage of the collector voltage generation section being applied to the collector terminal and an output of the voltage controlled oscillator being inputted to the base terminal; and a base bias circuit for applying a base voltage to the bipolar transistor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a partially enlarged diagram of FIG. 5;

DESCRIPTION OF THE PREFERRED EMBODIMENTS

Prior to describing the embodiments of the present invention, the reason is described that in the saturation region of a bipolar transistor, output power variations cannot be sufficiently minimized by simply performing temperature compensation on a base voltage Vbb. First, a comparison is made between a collector voltage region (hereinafter referred to as the "non-saturation region") where output power variations can be minimized by simply performing temperature compensation on a base voltage Vbb and a collector voltage region (hereinafter referred to as the "saturation region") where output power variations cannot be minimized by simply performing temperature compensation on a base voltage Vbb.

Figure 1:
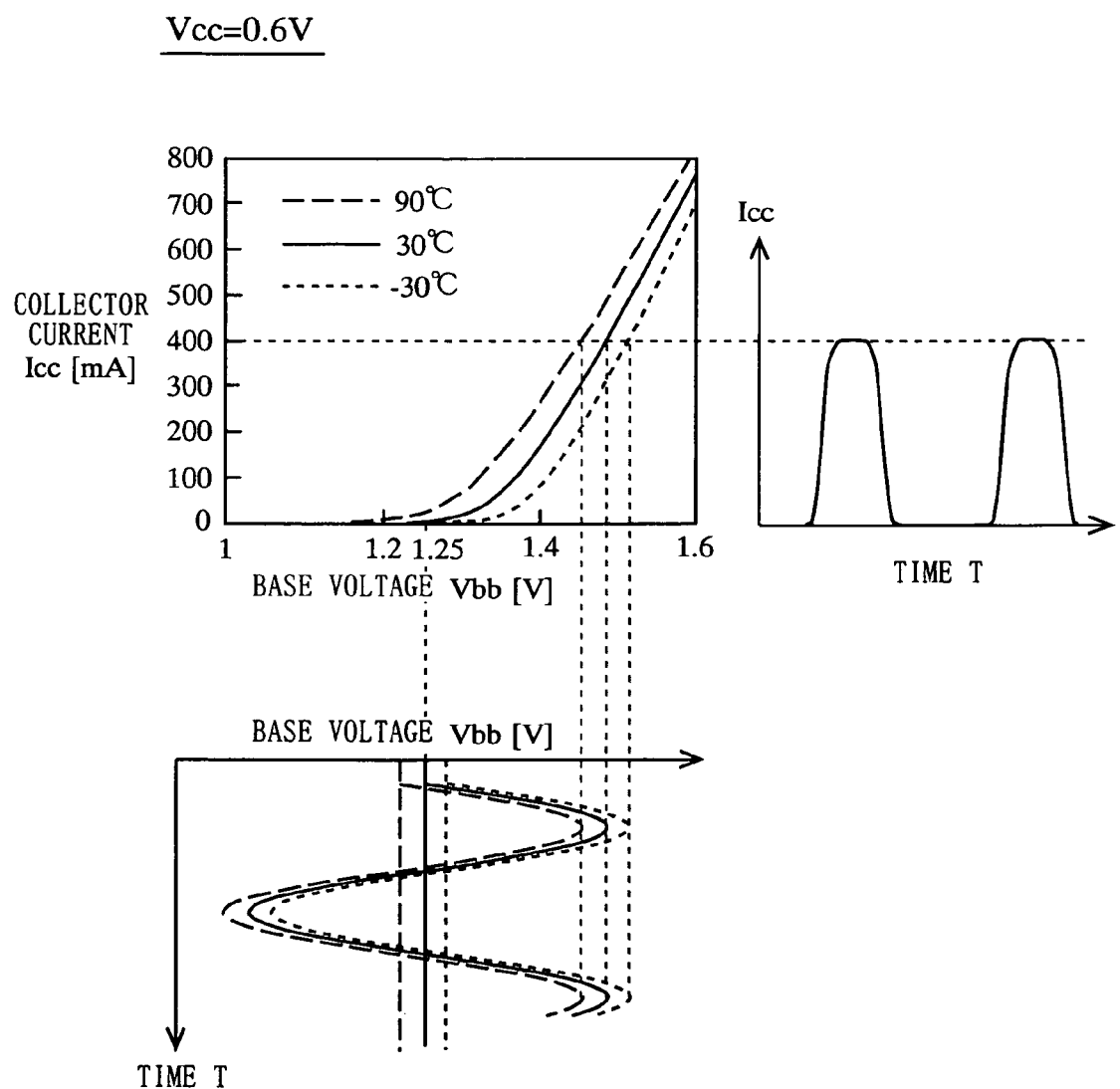
FIG. 1 is a diagram showing a mutual conductance, a base voltage waveform, and a collector current waveform when the collector voltage is 0.6 V.
Figure 2:
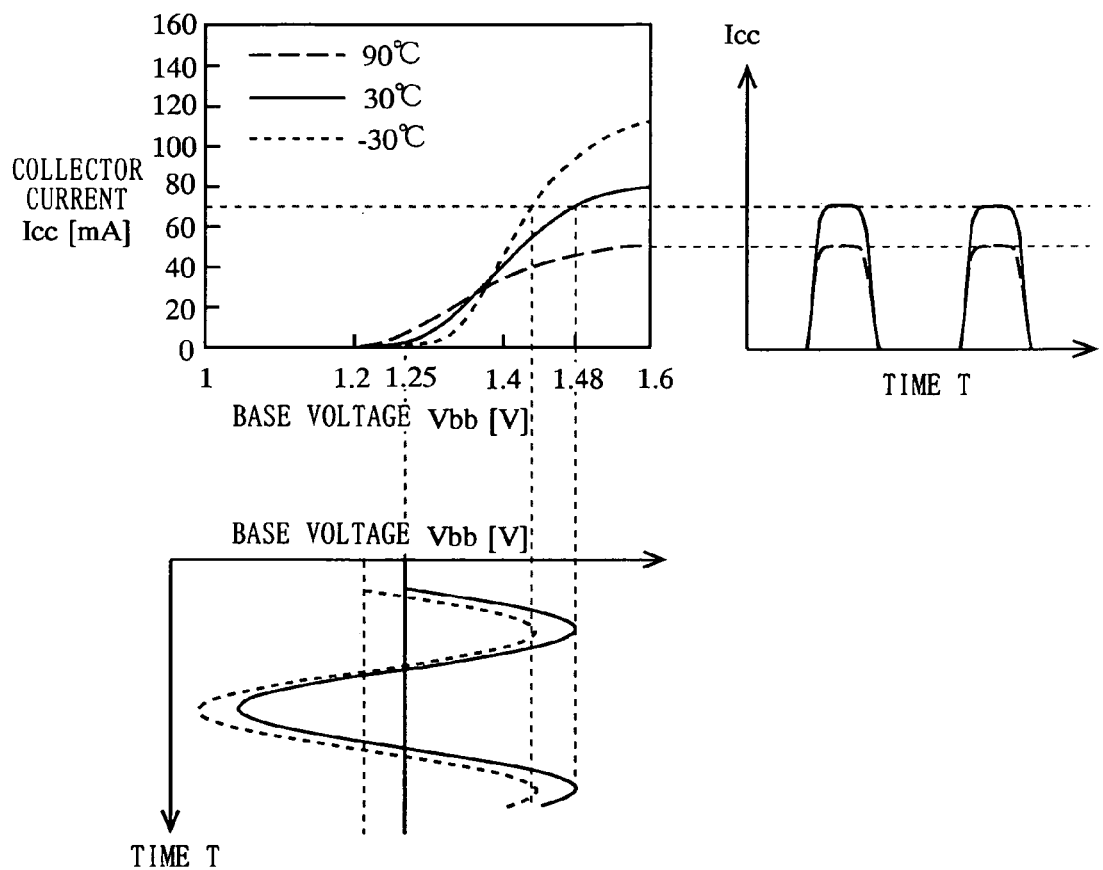
FIG. 2 is a diagram showing a mutual conductance, a base voltage waveform, and a collector current waveform when the collector voltage is 0.1 V.

FIG. 1 is a diagram showing a mutual conductance (upper left), a base voltage waveform (lower left), and a collector current waveform (upper right) of a bipolar transistor when the collector voltage is fixed to 0.6V which is within the non-saturation region. FIG. 2 is a diagram showing a mutual conductance (upper left), a base voltage waveform (lower left), and a collector current waveform (upper right) when the collector voltage is fixed to 0.1 V which is within the saturation region. Note that the mutual conductance is expressed as a collector current Icc with respect to the base voltage Vbb. In FIGS. 1 and 2, dotted, solid, and dashed lines represent device temperatures of the bipolar transistor of −30° C., 30° C., and 90° C., respectively. Note that in the following a temperature of 30° C. which is room temperature is referred to as the "reference temperature", and the base voltage Vbb and the collector voltage Vcc at room temperature are referred to as the "reference base voltage Vbb (30° C.)" and "reference collector voltage Vcc (30° C.)", respectively.

With reference to FIG. 1, the case of obtaining a collector current of 400 mA is described. In FIG. 1, the base bias point of the reference base voltage Vbb (30° C.) is 1.25 V. At the reference temperature, by applying a reference base voltage Vbb (30° C.) to the base terminal, a desired collector current (400 mA) is obtained, and accordingly a desired output power is obtained. On the other hand, in the case where the actual temperature is −30° C. or 90° C., the application of a reference base voltage Vbb (30° C.) does not provide a desired collector current, which is clear from FIG. 1. Note, however, that by shifting the base bias point according to temperature, the voltage peak value is also shifted, and therefore a desired collector current can be obtained. As described above, in the non-saturation region, by applying an appropriate base offset voltage according to temperature to the reference base voltage Vbb (30° C.) in the base bias circuit, a desired output power can be obtained.

On the other hand, in the case where the collector voltage Vcc is in the saturation region, even if a base offset voltage is applied to the reference base voltage Vbb (30° C.), a desired collector current Icc cannot be obtained in some cases. Now, with reference to FIG. 2, the case of obtaining a collector current of 70 mA is described. In FIG. 2, the base bias point of the reference base Vbb (30° C.) is 1.25 V. At the reference temperature, by applying a reference base voltage Vbb (30° C.) to the base terminal, a desired collector current can be obtained. However, in the case where the actual temperature is 90° C., even if a base offset voltage is applied to the reference base voltage Vbb (30° C.), a collector current Icc of 70 mA cannot be obtained. In the case where the device temperature is −30° C., by applying a base offset voltage, a collector current of 70 mA can be obtained; however, since the base offset voltage to be applied is high, it becomes difficult to adjust the base offset voltage. As described above, in the saturation region, a desired output power cannot be obtained or is difficult to obtain by simply adjusting the base voltage Vbb.

Figure 3A:
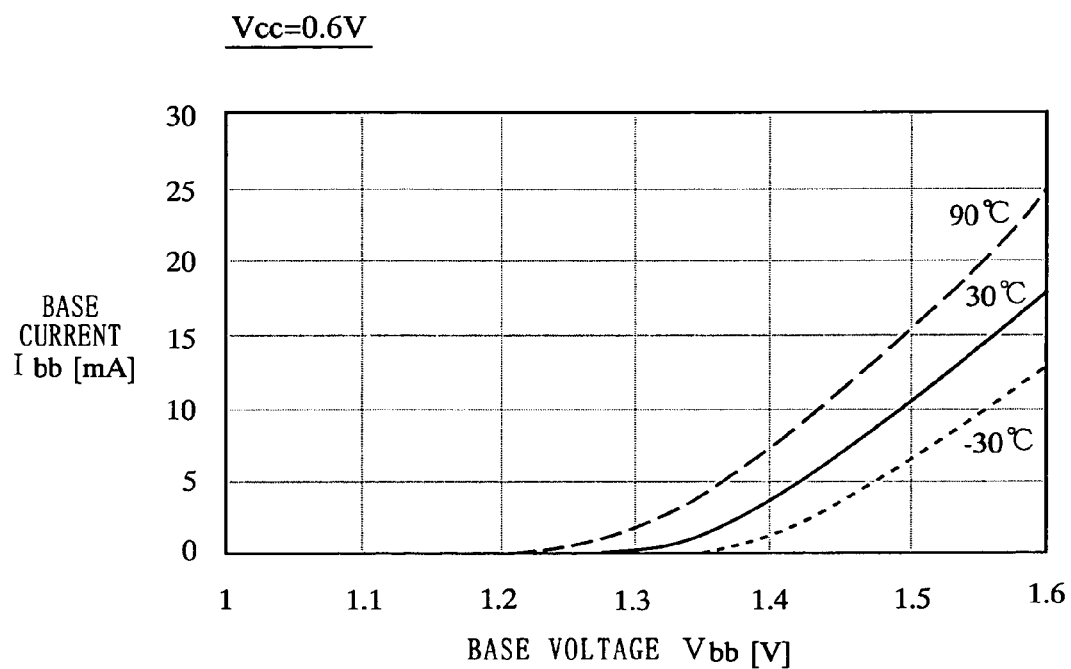
FIG. 3A is a diagram showing the relationship between a base voltage and a base current when the collector voltage is 0.6 V.
Figure 3B:
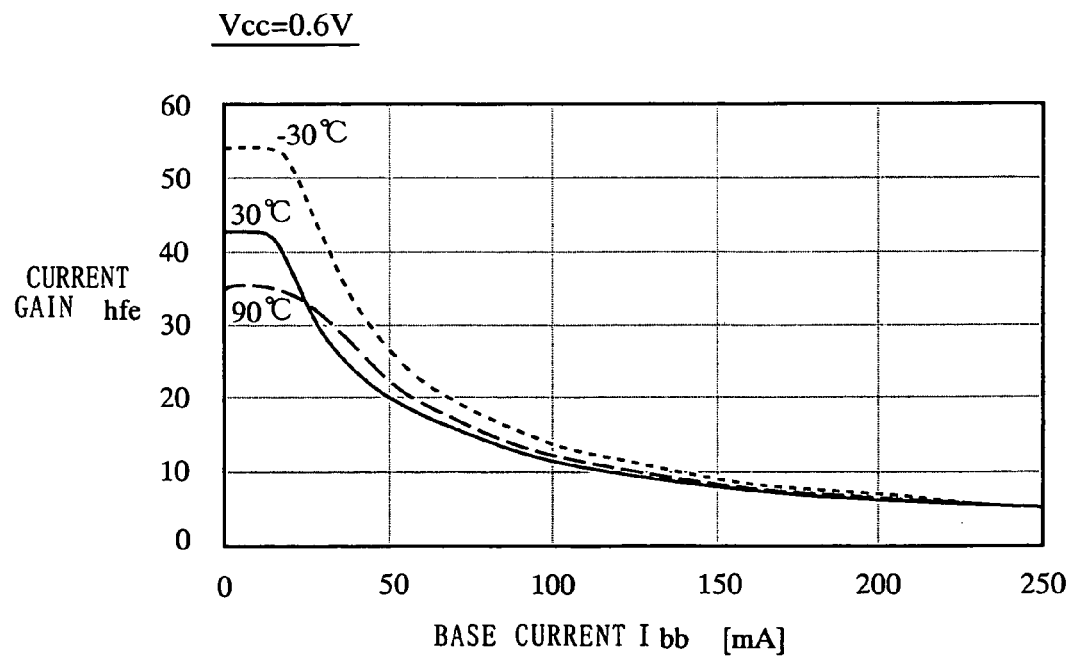
FIG. 3B is a diagram showing the relationship between a base current and a current gain hfe when the collector voltage is 0.6 V.
Figure 4A:
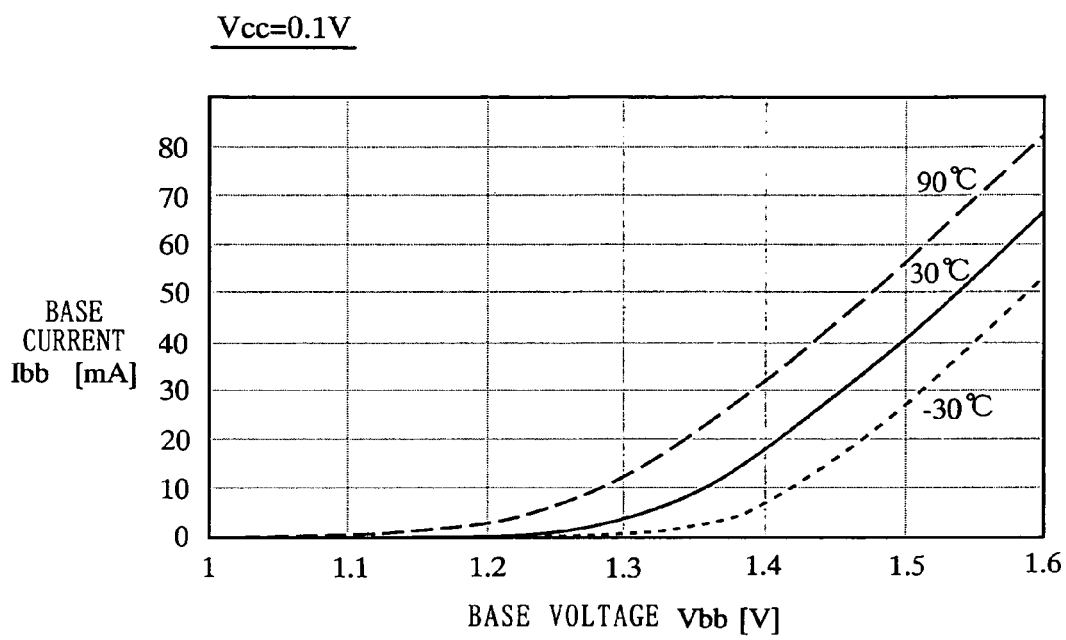
FIG. 4A is a diagram showing the relationship between a base voltage and a base current when the collector voltage is 0.1 V.
Figure 4B:
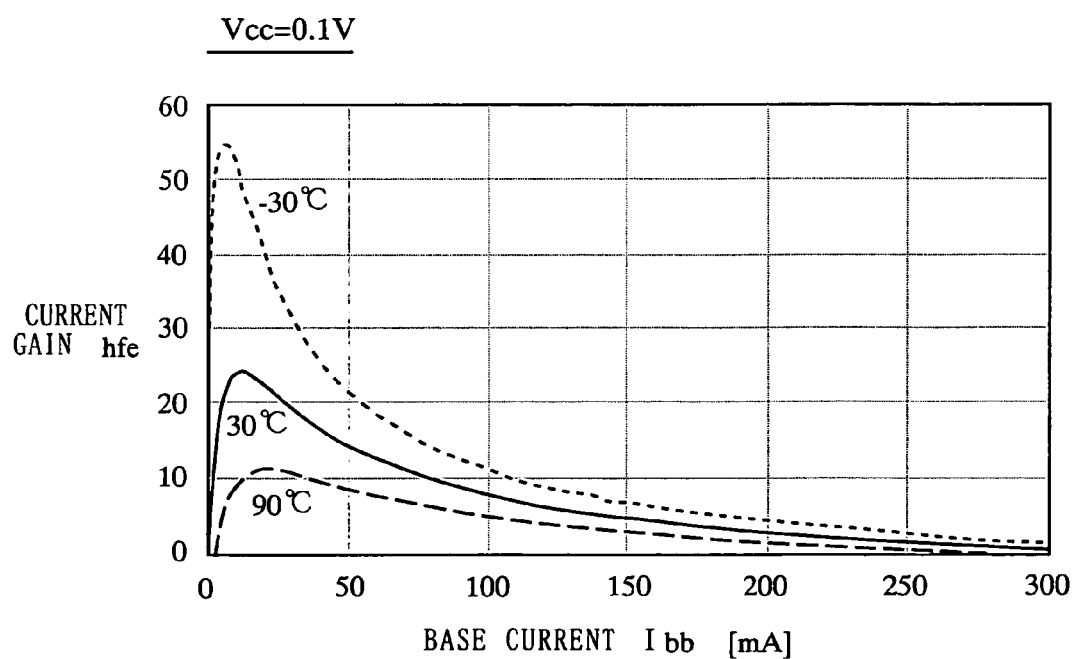
FIG. 4B is a diagram showing the relationship between a base current and a current gain hfe when the collector voltage is 0.1 V.

The reason that the mutual conductance differs between the non-saturation region and the saturation region, as shown in FIGS. 1 and 2, will be described with reference to FIGS. 3A, 3B, 4A, and 4B. FIGS. 3A and 4A are diagrams showing the relationship (hereinafter referred to as the "base I-V characteristics") between a base voltage Vbb and a base current Ibb when the collector voltages are fixed to 0.6 V and 0.1 V, respectively. FIGS. 3B and 4B are diagrams showing the relationship between a base current Ibb and a current gain hfe when the collector voltages Vcc are fixed to 0.6 V and 0.1 V, respectively. The collector currents Icc shown in FIGS. 1 and 2 are determined by multiplying the base currents Ibb shown in FIGS. 3A and 4A by the current gains hfe=(Icc/Ibb) shown in FIGS. 3B and 4B, respectively.

The relationship between the base voltage Vbb shown in FIGS. 3A and 4A and the base current Ibb is expressed by the following equation (1):

$$Ibb = \exp(Vbb/kT) \quad (1),$$

where k is Boltzmann constant and T is device temperature. As can be seen from equation (1) and FIGS. 3A and 4A, the curves indicating the base I-V characteristics do not change whether the collector voltage Vcc is in the saturation region or not. Specifically, regardless of whether the collector voltage Vcc is in the saturation region or in the non-saturation region, the start-up voltage for the base current Ibb is more on the low-voltage side at high temperature than at the reference temperature, and is on the high-voltage side at low temperature; in addition, the base current Ibb with the same base voltage Vbb is higher at high temperature than the reference voltage, and is lower at low temperature. The distance between the curve indicating the reference temperature and the curves indicating temperatures of −30° C. and 90° C. does not change much by the magnitude of the base voltage Vbb. From FIGS. 3A and 4A, it can be seen that the difference in mutual conductance between the non-saturation region and the saturation region, as shown in FIGS. 1 and 2, is not caused by the base voltage Vbb or the base current Ibb.

Next, the difference in current gain hfe between the non-saturation region (Vcc=0.6 V) and the saturation region (Vcc=0.1 V) will be examined. In the case where the collector voltage Vcc is 0.6 V as shown in FIG. 3A, in a region where the base voltage Vbb ranges from 1.4 to 1.6 V, the base currents Ibb at device temperatures of −30° C., 30° C., and 90° C. range from 2 to 13 mA, from 4 to 17 mA, and from 7.5 to 25 mA, respectively. From FIG. 3B, it can be seen that although the current gains hfe at these base current values vary in magnitude with temperature, the behavior in which the current gain hfe changes is the same regardless of temperature.

On the other hand, in the case where the collector voltage Vcc is 0.1 V as shown in FIG. 4A, in a region where the base voltage Vbb ranges from 1.4 to 1.6 V, the base currents Ibb at device temperatures of −30° C., 30° C., and 90° C. range from 8 to 53 mA, from 18 to 66 mA, and from 32 to 83 mA, respectively. As shown in FIG. 4B, the current gains hfe at these base current values change with the collector current Icc, and the degree of change in current gain hfe greatly varies depending on the temperature.

From the above, it can be said that variations in the ways in which current gains hfe fluctuate with temperature have the most influence on the temperature dependence of mutual conductance shown in FIGS. 1 and 2. Hence, by making the ways in which current gains hfe in a base voltage region to be used fluctuate the same regardless of temperature, the characteristics in the saturation region as shown in FIG. 2 can be made to be characteristics such as those shown in FIG. 1. By obtaining characteristics such as those shown in FIG. 1, it is possible to obtain a desired output power by simply performing conventional temperature compensation by a base bias circuit.

Figure 5:
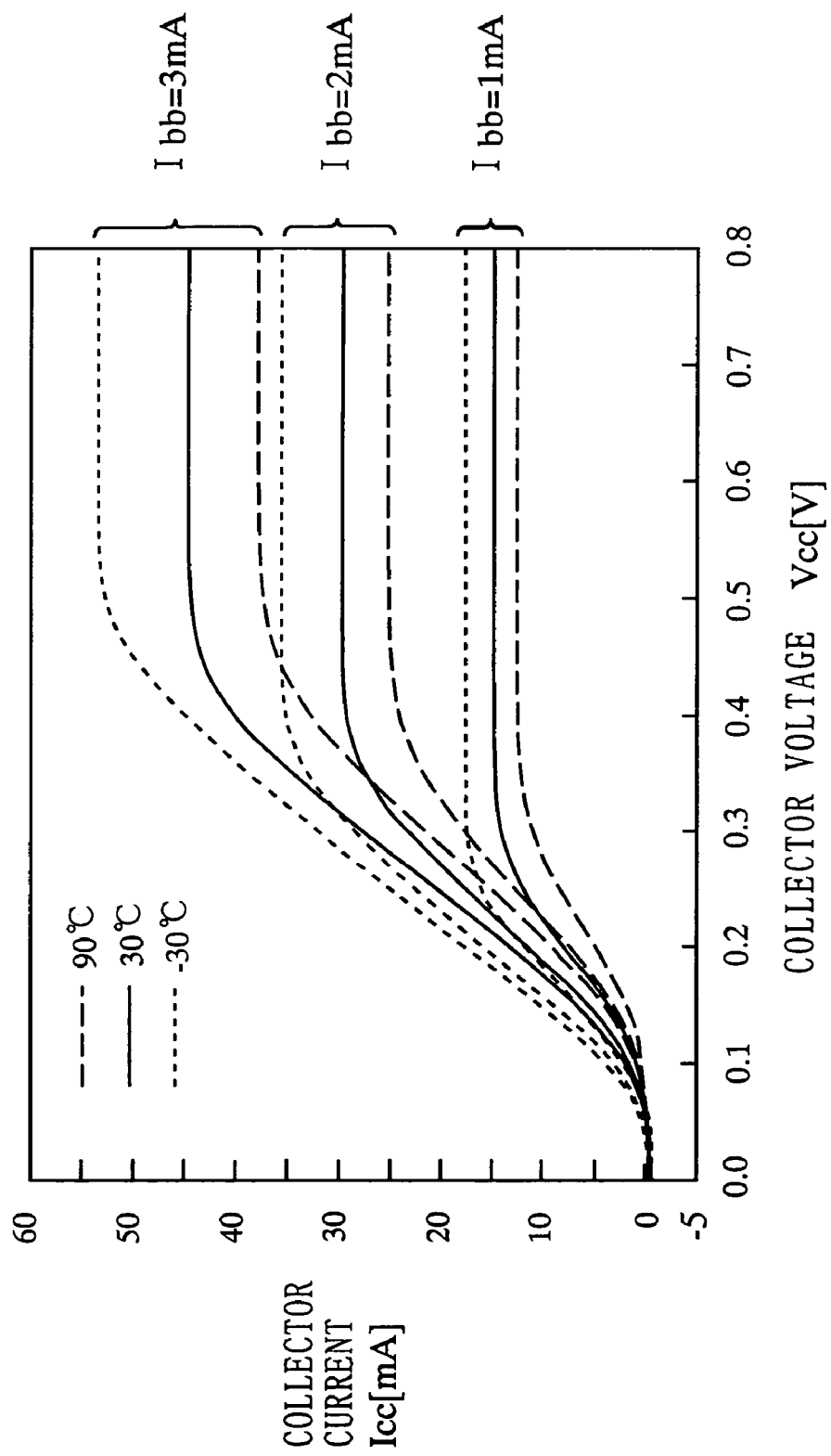
FIG. 5 is a diagram showing the relationship between a collector voltage and a collector current.

Now, the superordinate concept of the present invention, i.e., a method of making, when the high-frequency transistor operates in the saturation region, the behavior in which the current gain hfe changes the same regardless of temperature, will be described. FIG. 5 is a diagram showing the collector current Icc-collector voltage Vcc characteristics (hereinafter referred to as the "collector I-V characteristics") for the case where the device temperature is −30° C., 30° C., and 90° C. FIG. 6 is a partially enlarged diagram of FIG. 5. In FIGS. 5 and 6, the base current Ibb is constant. In the saturation region where the collector voltage Vcc is equal to or lower than about 0.5 V, the start-up voltage for the collector current Icc is lower at low temperature than the start-up voltage for the collector current Icc at the reference temperature, and is higher at high temperature than the start-up voltage for the collector current Icc at the reference temperature.

Figure 7:
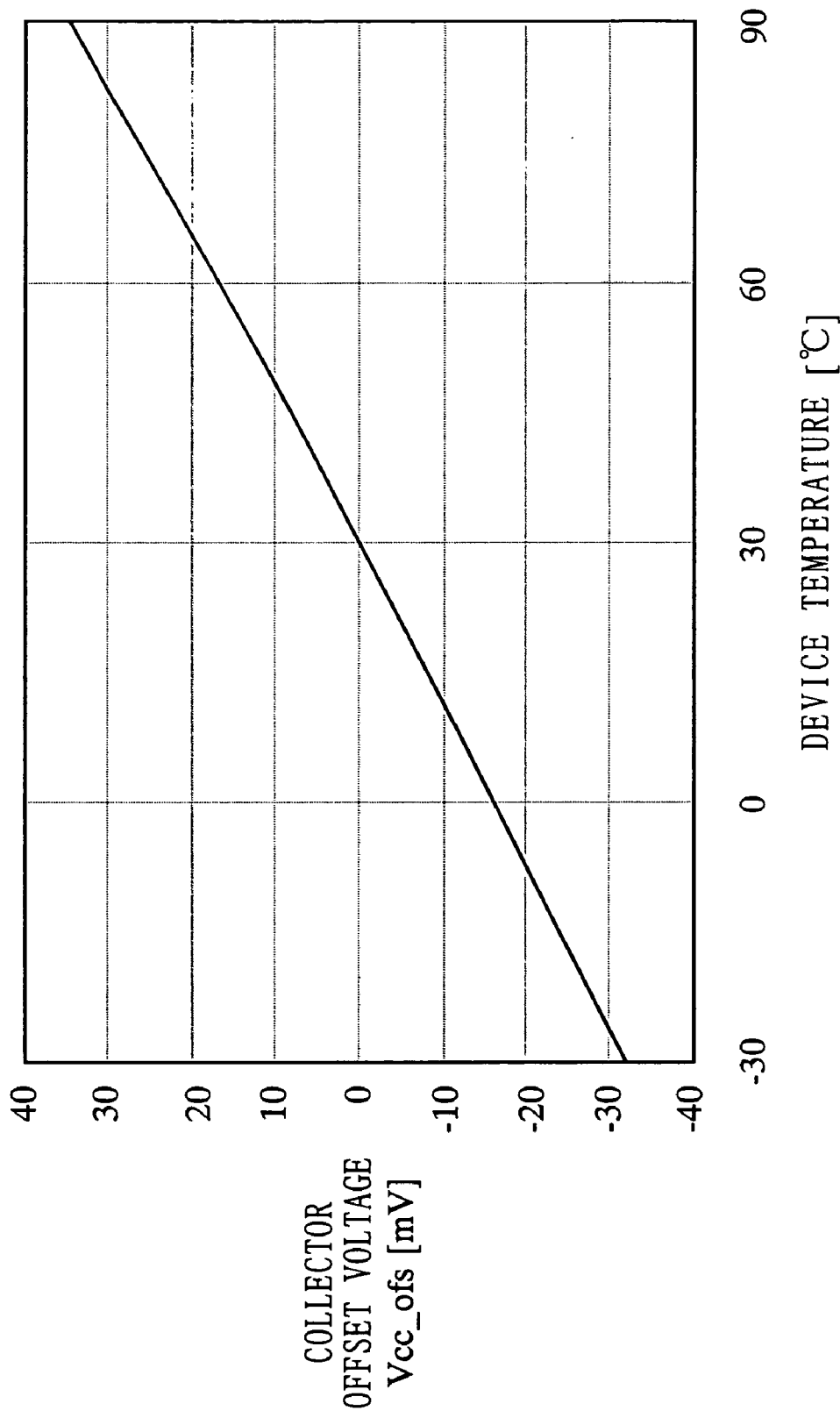
FIG. 7 is a diagram showing the relationship between a device temperature and a collector offset voltage.

In FIG. 6, in the case where a desired collector current Icc is 1 mA, for example, the reference collector voltage Vcc (30° C.) is 0.085 V. When the actual temperature is −30° C. and 90° C., as in the above-described case where temperature compensation is performed on the base voltage Vbb, by applying a temperature-dependent collector offset voltage Vcc_ofs (T) to the reference voltage, a desired collector voltage Vcc can be obtained. Specifically, when the actual temperature is 90° C., an offset voltage Vcc_ofs (90° C.)=A is applied to the reference voltage, and when the actual temperature is −30° C., an offset voltage Vcc_ofs (−30° C.)=−B is applied to the reference voltage. The relationship between the device temperature and the collector offset voltage Vcc_ofs (T) is determined by the fabrication method or structure of the bipolar transistor. The relationship between the device temperature and the collector offset voltage Vcc_ofs(T) can be represented by, for example, a simple line on a plot such as that shown in FIG. 7.

Figure 8:
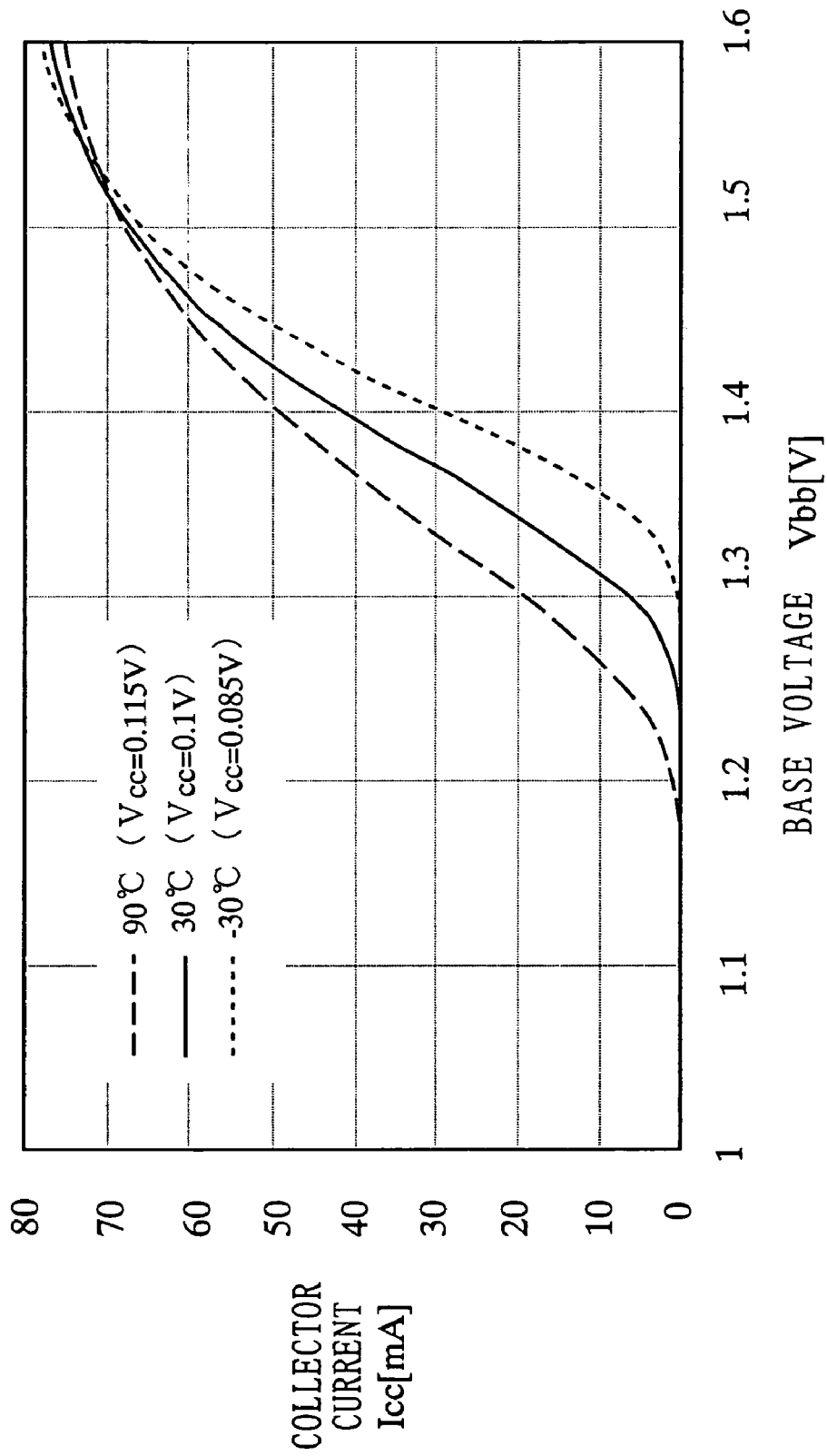
FIG. 8 is a diagram showing the relationship between a base voltage and a collector current, which is obtained through temperature compensation of a collector voltage.

FIG. 8 is a diagram showing the relationship between the base voltage Vbb and the collector current Icc for the case where temperature compensation is performed by applying a collector offset voltage Vcc_ofs to the reference collector voltage Vcc in the manner described above. As with the case of FIG. 2, the reference collector voltage Vcc (30° C.) is fixed to 0.1 V. When the device temperature is 90° C., a collector offset voltage Vcc_ofs (90° C.) of 15 mV is applied to the reference collector voltage Vcc (30° C.). When the device temperature is −30° C., a collector offset voltage Vcc_ofs (90° C.) of −15 mV is applied to the reference collector voltage Vcc (30° C.).

Figure 9:
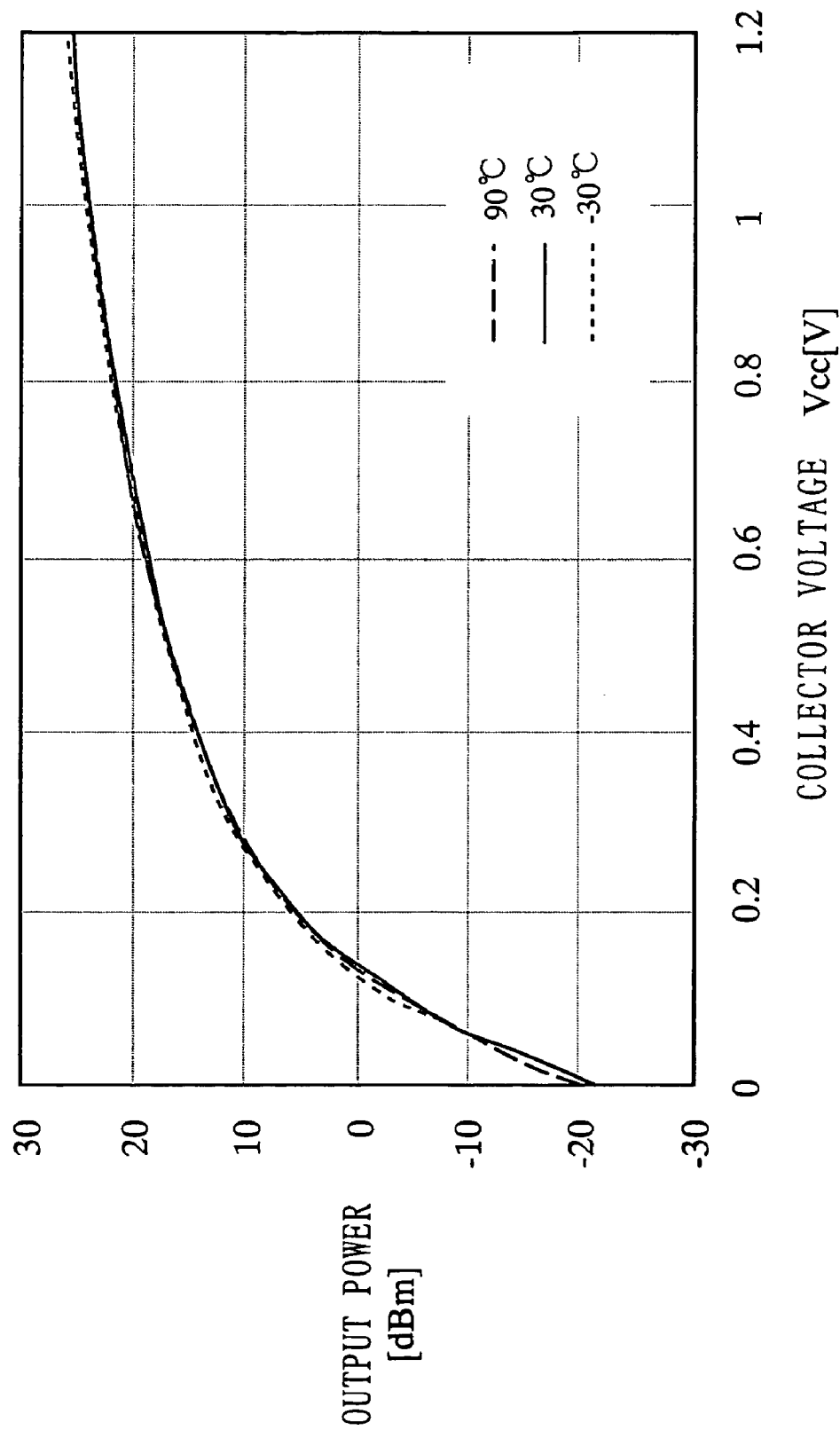
FIG. 9 is a diagram showing the relationship between a collector voltage and an output power of a high-frequency power amplifier of the present invention.

As shown in FIG. 8, in the curves obtained by performing temperature compensation on the collector voltages Vcc, unlike the curves shown in FIG. 2, the highest values of the collector currents Icc are substantially the same regardless of temperature. Although in FIG. 2 the base offset voltage may greatly vary depending on a desired collector current Icc, after performing temperature compensation on the collector voltages Vcc variations in base offset voltage are small. In the case where temperature compensation is performed on the collector voltages Vcc in the manner described above, the relationship between the collector voltage Vcc and the output power becomes such as that shown in FIG. 9, from which it can be seen that output power variations with temperature can be sufficiently minimized. Accordingly, a high-frequency power amplifier according to each embodiment of the present invention, as will be described below, has a temperature compensation circuit for compensating a collector voltage Vcc according to temperature. According to such a high-frequency power amplifier, output power variations in the saturation region can be minimized.

First Embodiment

Figure 10:
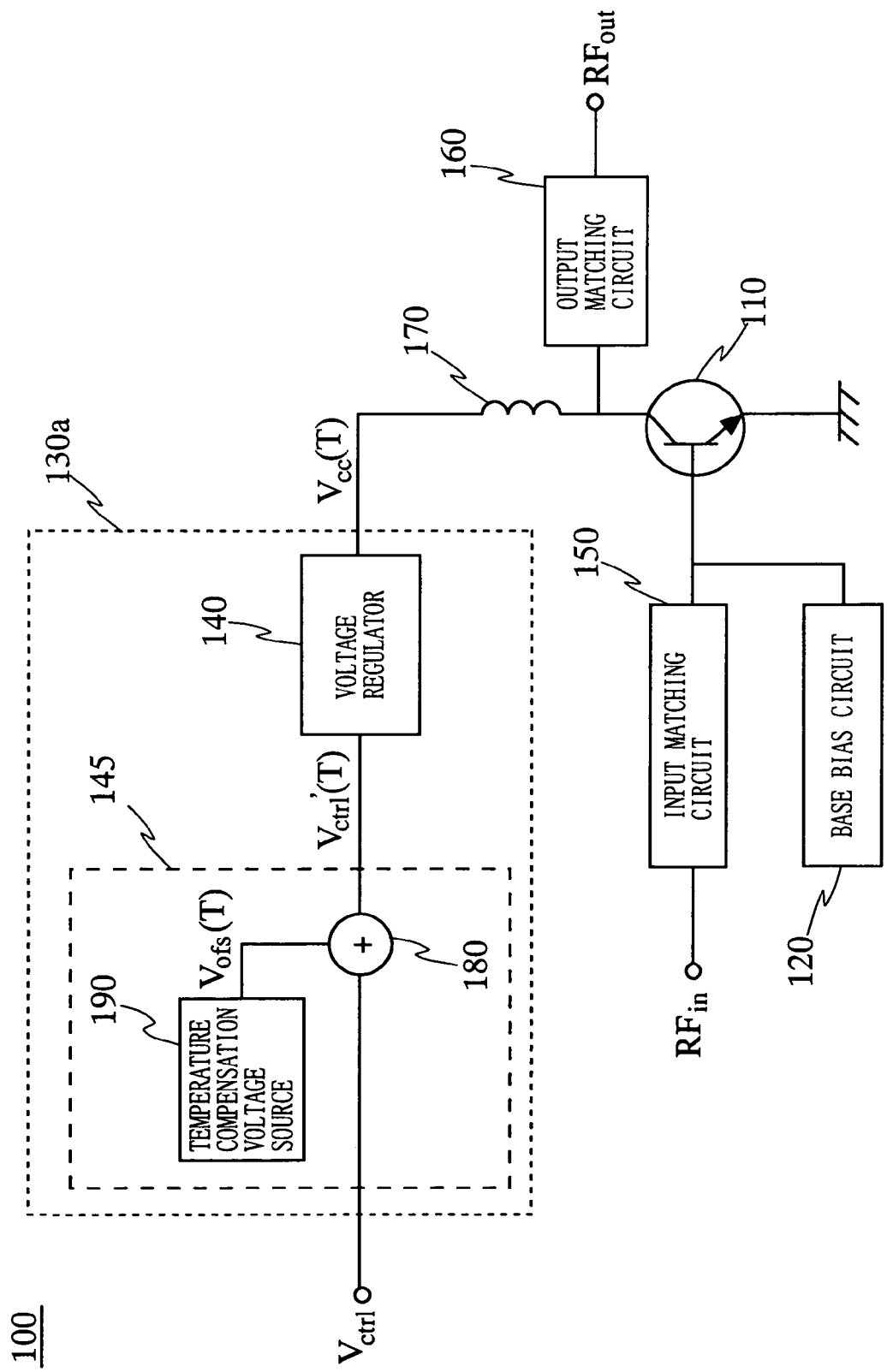
FIG. 10 is a circuit diagram illustrating a high-frequency power amplifier according to a first embodiment of the present invention.

FIG. 10 is an equivalent circuit diagram illustrating a high-frequency power amplifier 100 (hereinafter simply referred to as the "amplifier 100") according to a first embodiment of the present invention. The amplifier 100 includes a bipolar transistor 110, an RF choke inductor 170, a collector voltage generation section 130a, a base bias circuit 120, an input matching circuit 150, and an output matching circuit 160.

The collector voltage generation section 130a is connected to a collector terminal of the bipolar transistor 110 through the RF choke inductor 170. A power control signal Vctrl for controlling the magnitude of the output power is inputted to the collector voltage generation section 130a. The collector voltage generation section 130a includes a temperature compensation circuit 145 and a voltage regulator 140.

The input matching circuit 150 is connected to a base terminal of the bipolar transistor 110. A high-frequency input signal RFin is inputted to the base terminal of the bipolar transistor 110 through the input matching circuit 150. The high-frequency input signal RFin amplified by the bipolar transistor 110 is outputted as a high-frequency output signal RFout through the output matching circuit 160 connected to the collector terminal of the bipolar transistor 110. An emitter terminal of the bipolar transistor 110 is grounded.

The base bias circuit 120 adjusts a base voltage Vbb based on the device temperature of the bipolar transistor 110. The base bias circuit 120 performs temperature compensation such that a base offset voltage is applied to the reference base voltage Vbb according to the temperature, as described earlier with reference to FIGS. 1 and 8. Since such a base bias circuit has been generally and conventionally used and is not a key component of the present invention, a detailed description thereof will be omitted.

The temperature compensation circuit 145 includes a temperature compensation voltage source 190 and an adder 180. An offset voltage Vofs(T) for temperature compensation which is determined according to a temperature T, an output power, etc., is outputted from the temperature compensation voltage source 190. The adder 180 adds the offset voltage Vofs(T) for temperature compensation to an inputted power control voltage Vctrl. In this manner, a temperature compensation circuit output voltage Vctrl'(T) expressed by the following equation (2) is generated:

$$Vctrl'(T)=Vctrl+Vofs(T) \qquad (2).$$

The temperature compensation circuit output voltage Vctrl'(T) expressed by the above equation (2) is inputted to the voltage regulator 140 having a voltage gain of g and an offset voltage of Vdc. The output voltage from the voltage regulator 140, i.e., the output voltage Vcc(T) from the collector voltage generation section 130a, is expressed by the following equation (3):

$$Vcc(T)=g \cdot Vctrl'(T)+Vdc \qquad (3).$$

The power control signal Vctrl is a control signal which allows, when the device temperature is the reference temperature (e.g., T=30° C.), to obtain a desired output power without performing temperature compensation. Namely, $$Vofs(30° C.)=0 \qquad (4) \text{ and}$$

$$Vctrl'(30° C.)=Vctrl \qquad (5).$$

From equation (5), the reference collector voltage Vcc (30° C.) is expressed by the following equation (6):

$$Vcc(30° C.) = g \cdot Vctrl'(30° C.) + Vdc \qquad (6)$$
$$= g \cdot Vctrl + Vdc$$

At the reference temperature, the reference collector voltage Vcc (30° C.) is the voltage required to obtain an output power W. As described earlier, when the device temperature is T° C., the collector voltage Vcc(T) which is obtained by adding a collector offset voltage Vcc_ofs(T) to the reference collector voltage Vcc (30° C.), is the voltage required to obtain a desired output power W, as shown in the following equation (7):

$$Vcc(T)=Vcc(30° C.)+Vcc\_ofs(T) \qquad (7).$$

The collector offset voltage Vcc_ofs (T) can be obtained from the collector I-V characteristics of the bipolar transistor 110, as described earlier with reference to FIGS. 5 and 6.

If equation (6) is substituted into equation (7), the collector voltage Vcc(T) required to obtain a desired output power at a temperature T is expressed by the following equation (8):

$$Vcc(T) = g \cdot Vctrl + Vdc + Vcc\_ofs(T) \qquad (8)$$
$$= g(Vctrl + Vcc\_ofs(T)/g) + Vdc.$$

From equation (8), the temperature compensation circuit output voltage Vctrl' (T) is expressed by the following equation (9):

$$Vctrl'(T)=Vctrl+Vcc\_ofs(T)/g \qquad (9).$$

Therefore, the offset voltage Vofs (T) for temperature compensation is expressed by the following equation (10):

$$Vofs(T)=Vcc\_ofs(T)/g \qquad (10).$$

Figure 18:
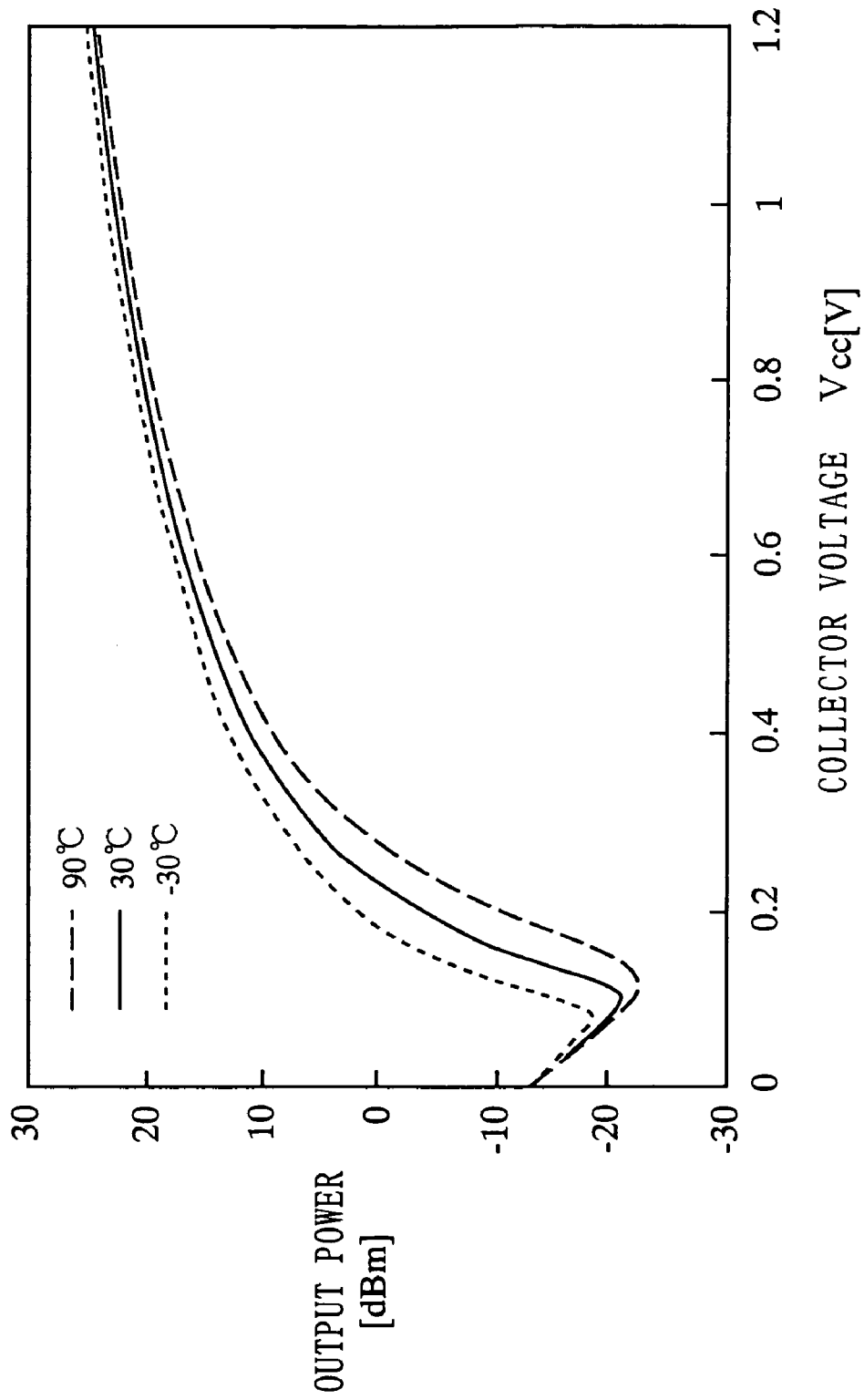
FIG. 18 is a diagram showing the relationship between a collector voltage and an output power of the conventional high-frequency power amplifier.

Note that the collector offset voltage Vcc_ofs(T) can also be obtained from the relationship between the collector voltage Vcc and the output power where temperature compensation is not performed, as shown in FIG. 18. Specifically, in FIG. 18, as shown in the following equation (11), the collector offset voltage Vcc_ofs(T) may be obtained by finding the difference between the reference collector voltage Vcc (30° C.) required to obtain a desired output power W and the collector voltage Vcc(T) required to obtain an output power W at an actual temperature T.

$$Vcc\_ofs(T)=Vcc(T)-Vcc(30°\ C.) \qquad (11)$$

The amplifier 100 can be used in a mobile phone and the like which uses a communication system, such as GSM, in which the output power is determined by the distance of the amplifier 100 from the base station. According to the amplifier 100, output power variations with temperature can be minimized even in the saturation region of the bipolar transistor, and thus the output power can be stabilized. Note that in the case where the amplifier 100 is used in a region other than the saturation region, temperature compensation does not necessarily need to be performed in the temperature compensation circuit 145. Note also that although FIG. 10 shows a single-stage high-frequency power amplifier 100, it is also possible to use a two or three-stage high-frequency power amplifier in which a plurality of bipolar transistors are cascade-connected to the bipolar transistor 110.

Note that the configuration of the temperature compensation circuit 145 is not limited to that shown in FIG. 10. Specifically, any circuit configuration can be employed as long as the circuit configuration allows to output, when a control voltage Vctrl is inputted to the temperature compensation circuit 145, a temperature compensation circuit output voltage Vctrl'(T) of a magnitude expressed by either equation (2) or (9). The temperature compensation circuit output voltage Vctrl'(T) may be generated using analog circuit processing in the temperature compensation circuit 145 or arithmetic processing by a digital circuit.

The temperature compensation circuit 145 may include a register which stores therein a table containing the values of the offset voltage Vofs(T) for temperature compensation for each temperature, and a microcomputer. In this case, in the temperature compensation circuit 145, for example, when a power control signal Vctrl is inputted, an offset voltage Vofs (T) may be read from the register according to the device temperature T measured by a temperature sensor or the like, and then a temperature compensation circuit output voltage Vctrl' (T) may be generated by performing digital arithmetic processing using the microcomputer.

A normal bipolar transistor may be used as the bipolar transistor 110 shown in FIG. 10; however, by using a heterojunction bipolar transistor (HBT) as the bipolar transistor 110, the advantages of the present invention can be further enhanced. The characteristics of the voltage regulator 140 may be any, and the magnitude of the temperature compensation circuit output voltage Vctrl' (T) may be determined according to the input/output characteristics of the voltage regulator. In the case of applying a collector offset voltage Vcc_ofs(T) of the same magnitude but of opposite polarity, the adder 180 shown in FIG. 10 can be replaced with a subtractor.

In the high-frequency power amplifier according to the present embodiment, a temperature compensation circuit is provided in the collector voltage generation section which supplies a voltage to the collector terminal of the bipolar transistor. The temperature compensation circuit compensates an application voltage according to temperature so as to obtain a desired output power at actual temperature. By this, output power variations with temperature in the saturation region of the bipolar transistor can be minimized.

Second Embodiment

Figure 11:
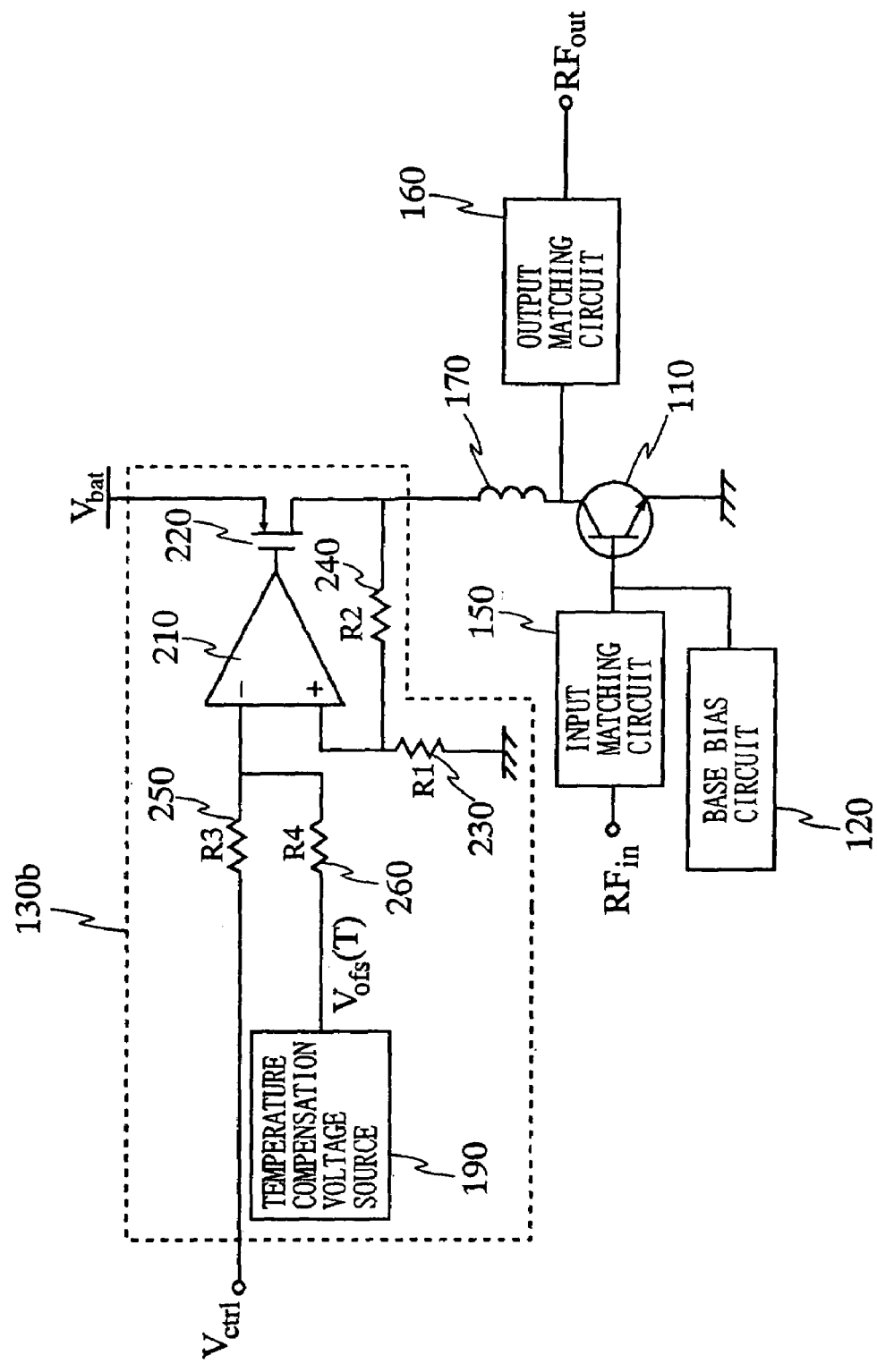
FIG. 11 is a circuit diagram illustrating a high-frequency power amplifier according to a second embodiment of the present invention.

FIG. 11 is a circuit diagram illustrating a high-frequency power amplifier 200 according to a second embodiment of the present invention. Note that in the high-frequency power amplifier 200, the same components as those of the first embodiment are designated by the same reference numerals, and the description thereof will be omitted.

A collector voltage generation section 130b includes a temperature compensation voltage source 190, an operational amplifier 210, resistors 230, 240, 250, and 260, and a P-type field-effect transistor 220 (hereinafter referred to as the "P-type FET 220"). The resistors 230, 240, 250, and 260 have resistance values of R1, R2, R3, and R4, respectively.

The collector voltage generation section 130b functions as both a temperature compensation circuit and a voltage regulator. The operational amplifier 210 and the resistors R3 and R4 together compose a two-input adder. The operational amplifier 210 and the P-type FET 220 compose a voltage regulator. To the operational amplifier 210, a power control signal Vctrl is inputted through the resistor 250 and an offset voltage Vofs(T) for temperature compensation outputted from the temperature compensation voltage source 190 is inputted through the resistor 260.

The relationship between the power control signal Vctrl inputted to the collector voltage generation section 130b and a collector voltage Vcc(T) outputted from the collector voltage generation section 130b is expressed by the following equation (12) using the offset voltage Vofs (T) for temperature compensation and the resistance values R1 to R4:

$$Vcc(T) = \left(\frac{R4}{R3+R4} \cdot Vctrl + \frac{R3}{R3+R4} \cdot Vofs(T)\right) \cdot \frac{R1+R2}{R2}. \qquad (12)$$

At the reference temperature, a desired output power W can be obtained without compensating the power control signal Vctrl. In this case, a reference collector voltage Vcc (30° C.) to be applied to the collector terminal of the bipolar transistor 110 is expressed by the following equation (13):

$$Vcc(30°\ C.) = \left(\frac{R4}{R3+R4} \cdot Vctrl\right) \cdot \frac{R1+R2}{R2}. \qquad (13)$$

In the case where the device temperature is T° C., too, by applying a temperature-dependent collector offset voltage Vcc_ofs(T) to the reference collector voltage Vcc (30° C.), the above-described desired output power W can be obtained. From equations (12) and (13) the collector offset voltage Vcc_ofs is expressed by the following equation (14):

$$\text{Vcc\_ofs}(T) = \frac{R3}{R2} \cdot \frac{R1+R2}{R3+R4} \cdot \text{Vofs}(T). \quad (14)$$

The value of the collector offset voltage Vcc_ofs(T) can be obtained, as described in the first embodiment, from the collector I-V characteristics shown in FIG. 6 or from the relationship between the collector voltage Vcc and the output power where temperature compensation is not performed, as shown in FIG. 18. The offset voltage Vofs(T) for temperature compensation can be obtained by performing a reverse operation on the above equation (14). As described above, by performing temperature compensation on the collector voltage, output power variations with temperature can be minimized even at low output power where the bipolar transistor is used in the saturation region. Note that the P-type FET 220 may be replaced with a PNP bipolar transistor.

Figure 12:
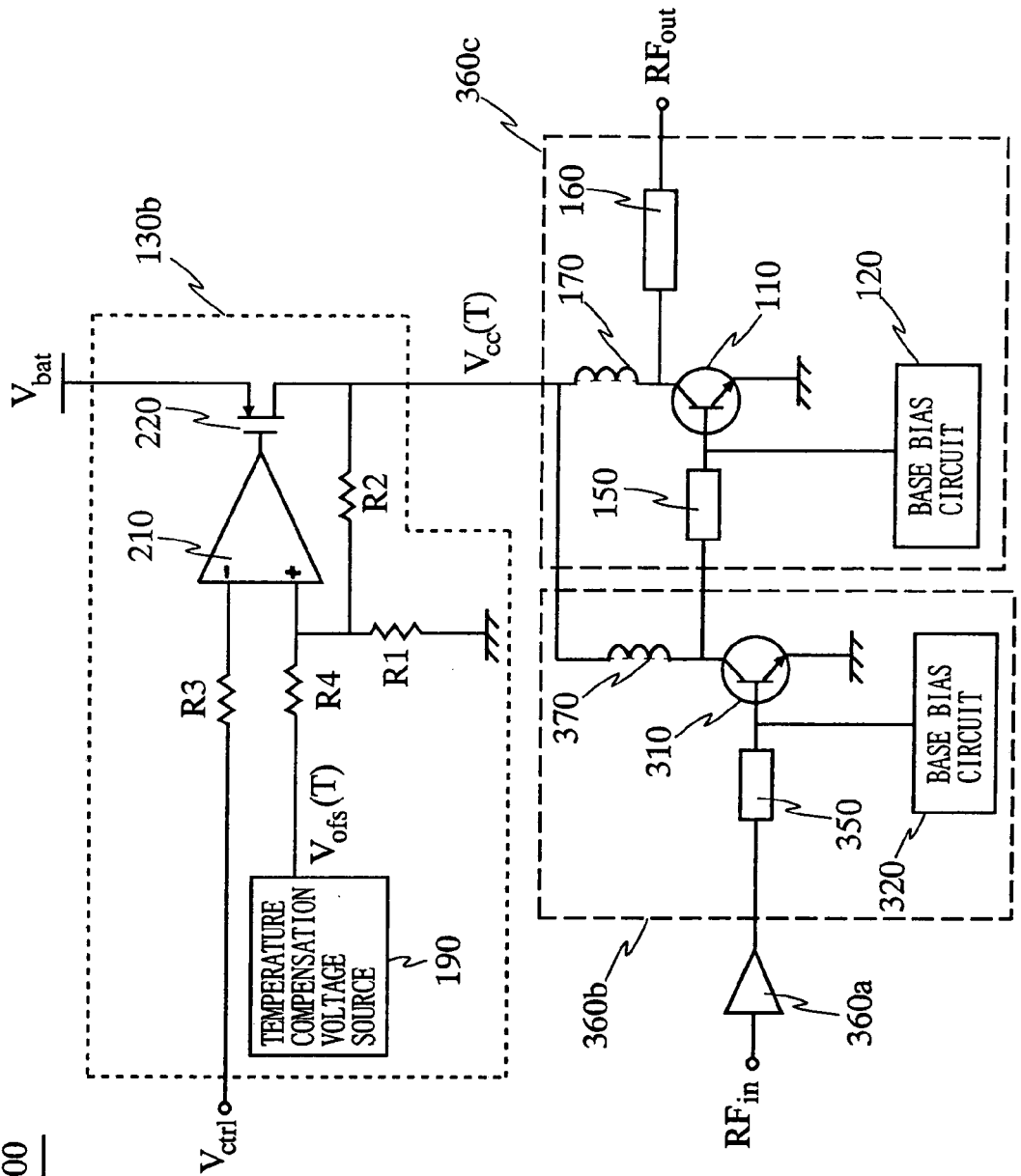
FIG. 12 is a diagram illustrating an exemplary application of the high-frequency power amplifier shown in FIG. 11.

In a high-frequency power amplifier used in a communication device such as a mobile phone, generally, amplification sections each including a bipolar transistor are used so as to be cascade-connected in multiple stages. FIG. 12 is an exemplary circuit diagram illustrating a cascade-connected high-frequency power amplifier 300. The high-frequency power amplifier 300 includes high-frequency power amplification sections 360a, 360b, and 360c and a collector voltage generation section 130b. An output signal of the high-frequency power amplification section 360a is inputted to a base terminal of a bipolar transistor 310, and an output signal of the high-frequency power amplification section 360b is inputted to a base terminal of a bipolar transistor 110.

The high-frequency power amplification section 360b includes the bipolar transistor 310, an input matching circuit 350, a base bias circuit 320, and an RF choke inductor 370. The high-frequency power amplification section 360c includes the bipolar transistor 110, an input matching circuit 150, a base bias circuit 120, an RF choke inductor 170, and an output matching circuit 160.

A collector terminal of each of the bipolar transistors 310 and 110 is electrically connected to the collector voltage generation section 130b. Hence, a collector voltage Vcc(T) based on a power control signal Vctrl and compensated according to temperature is applied to the bipolar transistors 310 and 110.

It is also possible to provide a collector voltage generation section to each of the high-frequency power amplification sections 360b and 360c so that the collector voltages Vcc(T) of the bipolar transistors 310 and 110 can be individually controlled.

Third Embodiment

Figure 13:
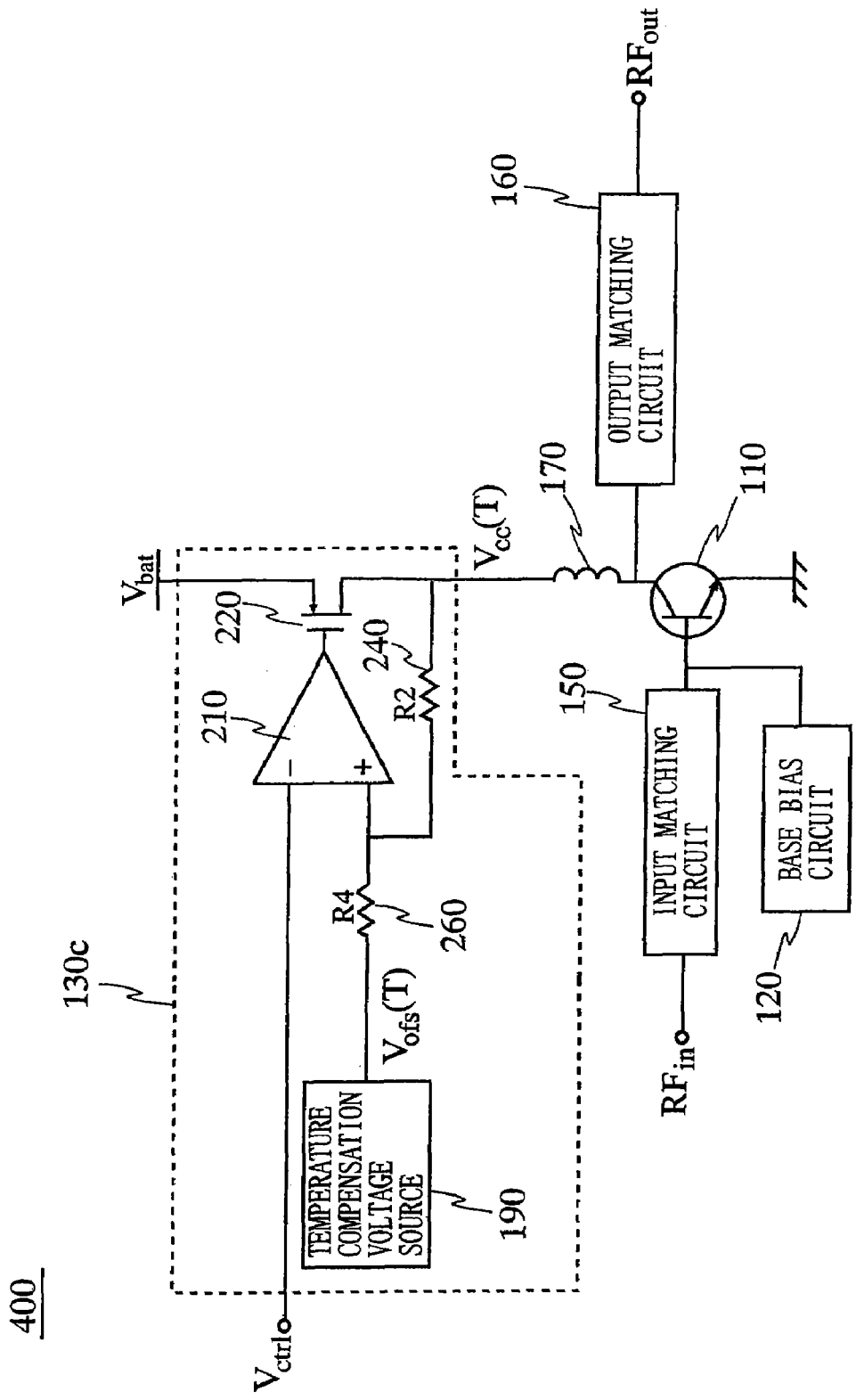
FIG. 13 is a circuit diagram illustrating a high-frequency power amplifier according to a third embodiment of the present invention.

FIG. 13 is a circuit diagram illustrating a high-frequency power amplifier 400 according to a third embodiment of the present invention. Note that in the high-frequency power amplifier 400, the same components as those of the first and second embodiments are designated by the same reference numerals, and the description thereof will be omitted.

A collector voltage generation section 130c includes a temperature compensation voltage source 190, an operational amplifier 210, resistors 240 and 260, and a P-type field-effect transistor (P-type FET) 220. The resistors 240 and 260 have resistance values of R2 and R4, respectively.

The collector voltage generation section 130c functions as both a temperature compensation circuit and a voltage regulator. The operational amplifier 210 and the resistor R4 together compose a two-input subtractor. The operational amplifier 210 and the P-type FET 220 compose a voltage regulator. A power control signal Vctrl is inputted to a negative input of the operational amplifier 210. An offset voltage Vofs(T) for temperature compensation outputted from the temperature compensation voltage source 190 is inputted to a positive input of the operational amplifier 210 through the resistor 260.

The relationship between the power control signal Vctrl inputted to the collector voltage generation section 130c and a collector voltage Vcc(T) outputted from the collector voltage generation section 130c is expressed by the following equation 15 using the offset voltage Vofs(T) for temperature compensation and the resistance values R2 and R4:

$$Vcc(T) = \frac{R2+R4}{R4} \cdot Vctrl - \frac{R2}{R4} \cdot Vofs(T). \quad (15)$$

At the reference temperature, a desired output power W can be obtained without compensating the power control signal Vctrl. In this case, a reference collector voltage Vcc (30° C.) to be applied to the collector terminal of the bipolar transistor 110 is expressed by the following equation 16:

$$Vcc(30°\,C.) = \frac{R2+R4}{R4} \cdot Vctrl. \quad (16)$$

The collector voltage Vcc(T) required to obtain the above desired output power W when the device temperature is T° C. is the voltage obtained by adding a temperature-dependent collector offset voltage Vcc_ofs(T) to the reference collector voltage Vcc (30° C.), and is expressed by the following equation 17:

$$Vcc(30°\,C.) = \frac{R2+R4}{R4} \cdot Vctrl + Vcc\_ofs. \quad (17)$$

From equations 15 and 17, the offset voltage Vofs(T) for temperature compensation is expressed by the following equation 18:

$$Vofs(T) = -\frac{R4}{R2} \cdot Vcc\_ofs(T). \quad (18)$$

The value of the collector offset voltage Vcc_ofs(T) can be obtained, as described in the first embodiment, from the collector I-V characteristics shown in FIG. 5 or from the relationship between the collector voltage Vcc and the output power where temperature compensation is not performed, as shown in FIG. 18. As described above, by performing temperature compensation on the collector voltage, output power variations with temperature can be minimized even at low output power where the bipolar transistor is used in the saturation region.

Figure 14:
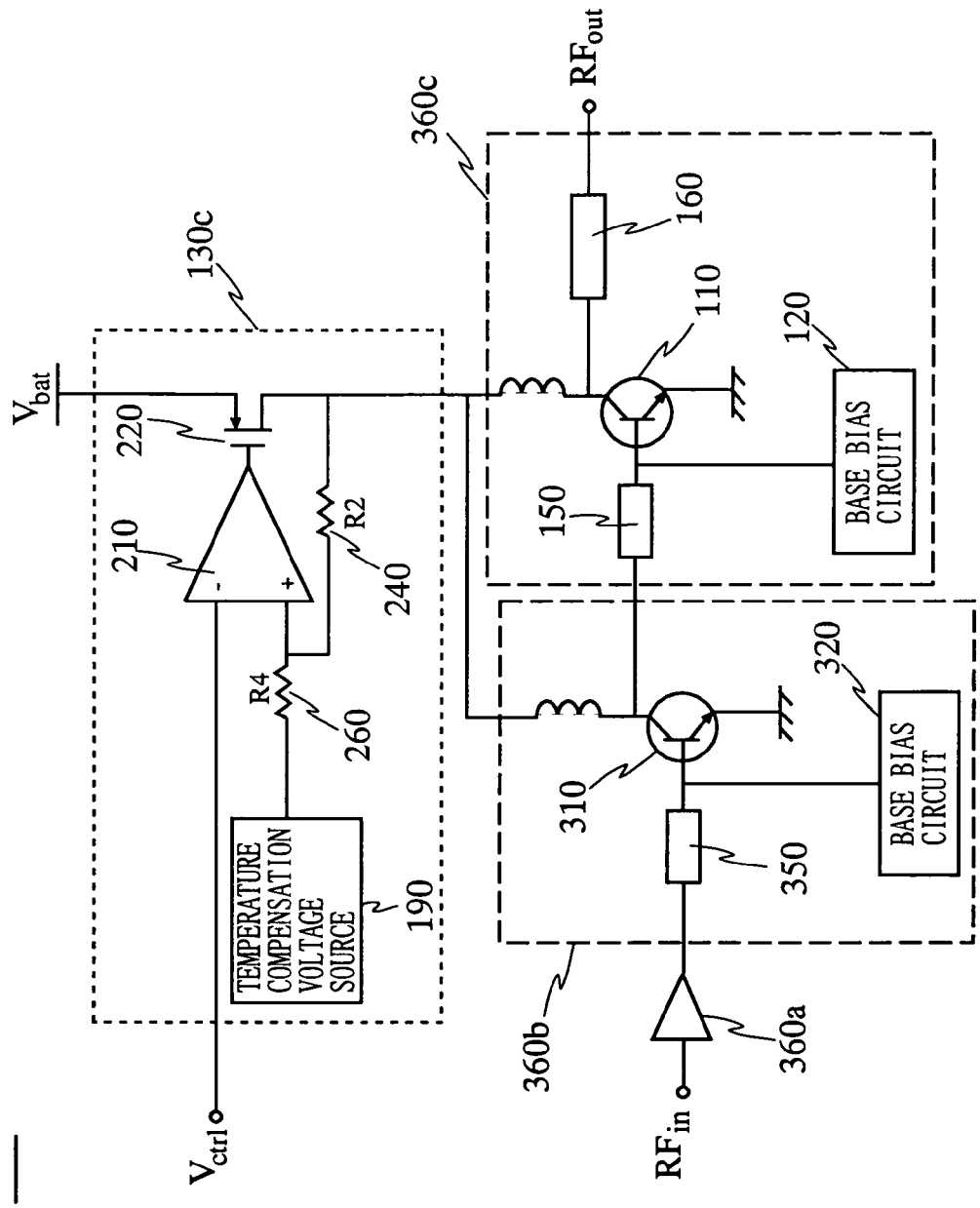
FIG. 14 is a diagram illustrating an exemplary application of the high-frequency power amplifier shown in FIG. 13.

In a high-frequency power amplifier used in a communication device such as a mobile phone, generally, amplification sections each including a bipolar transistor are used so as to be cascade-connected in multiple stages. FIG. 14 is a circuit diagram illustrating a high-frequency power amplifier 500 including cascade-connected high-frequency power amplification sections 360a, 360b, and 360c. A collector terminal of each of bipolar transistors 310 and 110 is electrically connected to a collector voltage generation section 130c. Hence, a collector voltage Vcc(T) based on a power control signal Vctrl and compensated according to temperature is applied to the bipolar transistors 310 and 110.

In FIG. 14, it is also possible to provide a collector voltage generation section to each of the high-frequency power amplification sections 360b and 360c so that the collector voltages Vcc(T) of the bipolar transistors 310 and 110 can be individually controlled.

Fourth Embodiment

Figure 15:
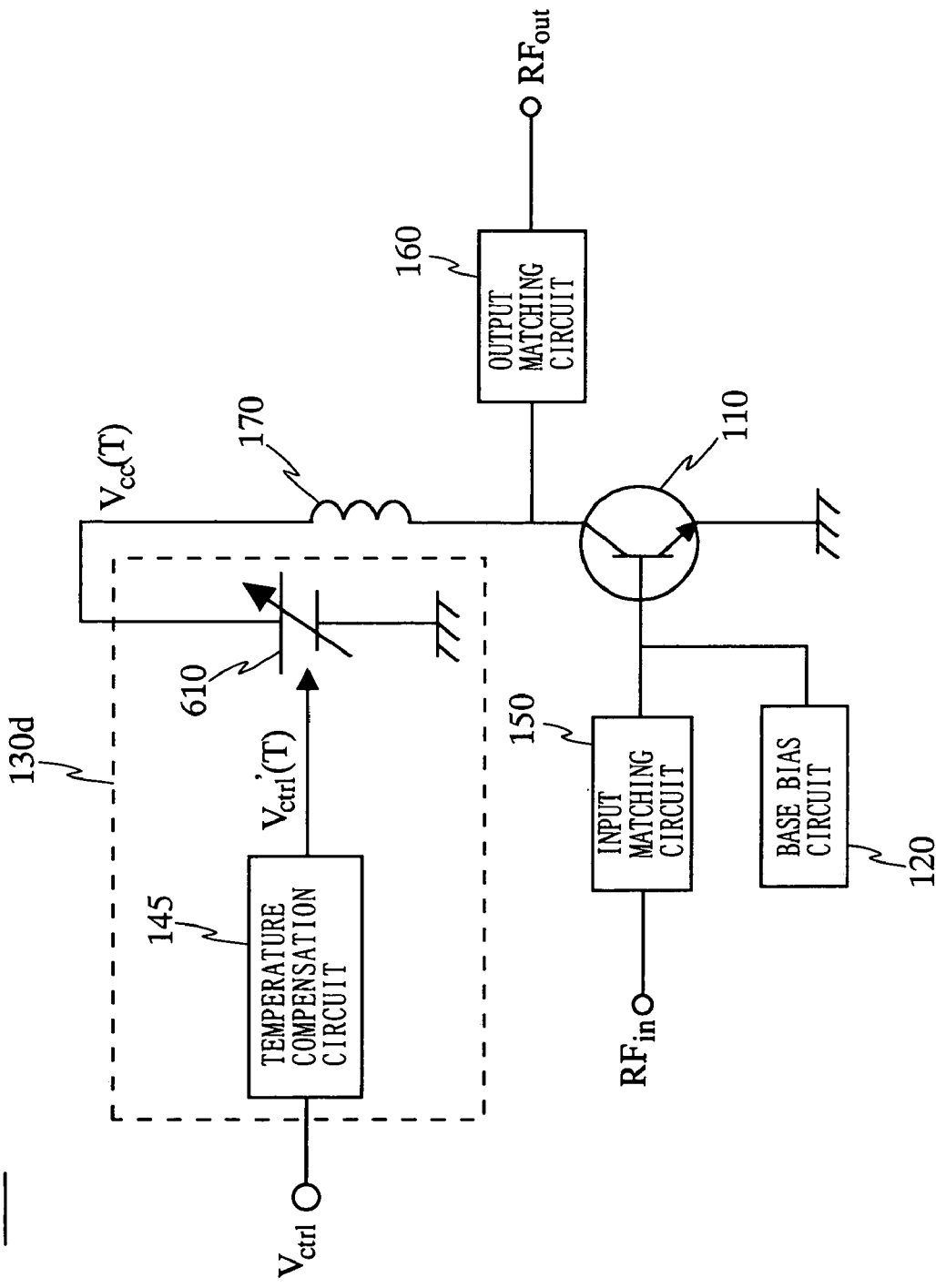
FIG. 15 is a circuit diagram illustrating a high-frequency power amplifier according to a fourth embodiment of the present invention.

FIG. 15 is a circuit diagram showing a configuration of a high-frequency power amplifier 600 according to a fourth embodiment of the present invention. Note that in the high-frequency power amplifier 600, the same components as those of the first embodiment, etc., are designated by the same reference numerals, and the description thereof will be omitted. A collector voltage generation section 130d of the high-frequency power amplifier 600 includes a temperature compensation circuit 145 and a DC/DC converter 610. The temperature compensation circuit 145 generates a temperature compensation circuit output voltage Vctrl'(T) having a temperature dependence by, as described in the first embodiment, for example, adding a temperature-dependent offset voltage Vofs(T) for temperature compensation to a power control signal Vctrl.

The temperature compensation circuit output voltage Vctrl' (T) is inputted to the DC/DC converter 610. The magnitude of the temperature compensation circuit output voltage Vctrl' (T) may be determined according to the input/output characteristics of the DC/DC converter 610. Specifically, the magnitude of the temperature compensation circuit output voltage Vctrl' (T) may be determined such that a desired collector voltage Vcc(T) is outputted from the DC/DC converter 610.

Note that although FIG. 15 shows a single-stage high-frequency power amplifier 600, it is also possible to use a two or three-stage high-frequency power amplifier in which a plurality of bipolar transistors are cascade-connected to a bipolar transistor 110.

Fifth Embodiment

Figure 16:
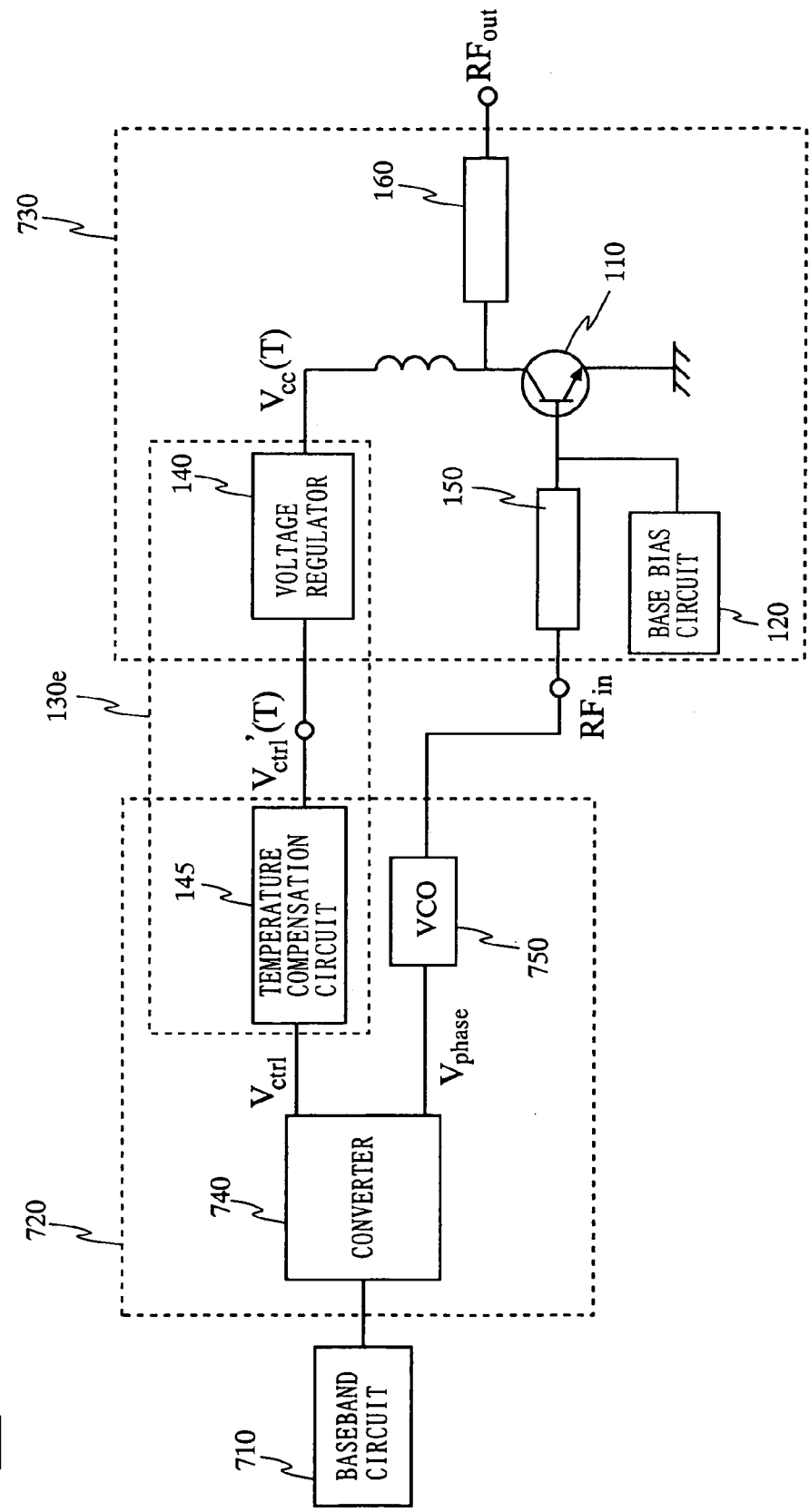
FIG. 16 is a circuit diagram illustrating a communication apparatus according to a fifth embodiment of the present invention.
Figure 17:
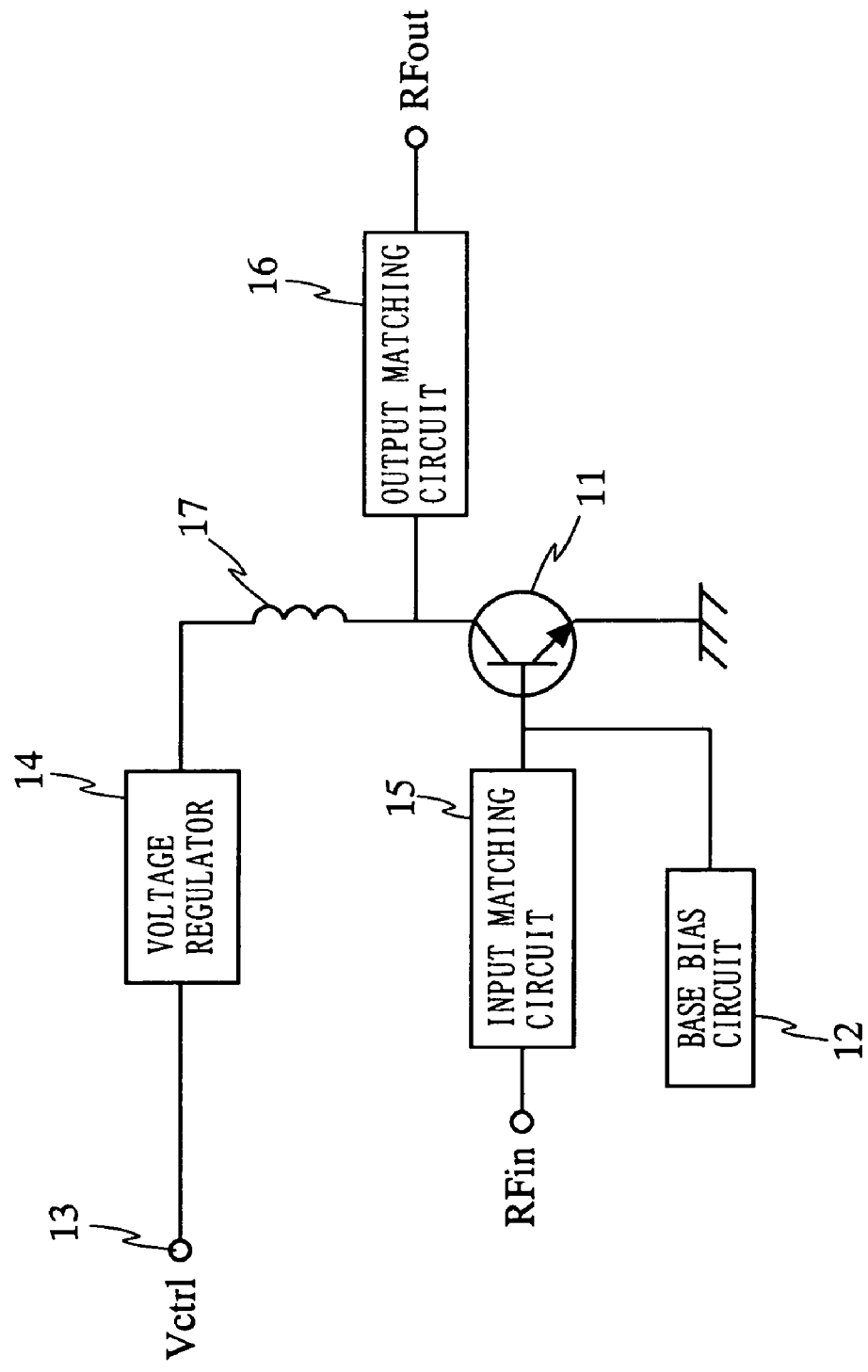
FIG. 17 is a diagram showing a configuration of a conventional high-frequency power amplifier.

FIG. 16 is a diagram showing a configuration of a communication apparatus 700 according to a fifth embodiment of the present invention. The communication apparatus 700 can be used as a communication device such as a mobile phone. Note that in the communication apparatus 700, the same components as those of the foregoing embodiments are designated by the same reference numerals, and the description thereof will be omitted.

The communication apparatus 700 includes a baseband circuit 710, an RF modulation circuit 720, and a high-frequency power amplifier 730. The RF modulation circuit 720 includes a converter 740, a temperature compensation circuit 145, and a voltage controlled oscillator (VCO) 750. The high-frequency power amplifier 730 includes a bipolar transistor 110, a voltage regulator 140, a base bias circuit 120, an input matching circuit 150, and an output matching circuit 160. The temperature compensation circuit 145 and the voltage regulator 140 compose a collector voltage generation section 130e.

The converter 740 converts an IQ signal outputted from the baseband circuit 710 into an amplitude modulation signal and a phase modulation signal Vphase. The amplitude modulation signal is inputted as a power control signal Vctrl to the temperature compensation circuit 145. The phase modulation signal Vphase is inputted to the voltage controlled oscillator 750. In the voltage controlled oscillator 750, the oscillatory frequency is controlled based on the phase modulation signal Vphase. An output signal of the voltage controlled oscillator 750 is inputted to the bipolar transistor 110 through the input matching circuit 150.

The temperature compensation circuit 145 performs arithmetic processing on the inputted power control signal Vctrl, and then outputs a temperature compensation circuit output voltage Vctrl' (T). The temperature compensation circuit output voltage Vctrl'(T) is inputted to the voltage regulator 140. Here, a collector voltage Vcc(T) is outputted from the voltage regulator 140 and applied to a collector terminal of the bipolar transistor 110.

Note that although, in the communication apparatus 700, the temperature compensation circuit 145 is provided outside the high-frequency power amplifier 730, the temperature compensation circuit 145 may be provided inside the high-frequency power amplifier 730, as described in the first to fourth embodiments. Note also that a DC/DC converter may be used instead of the voltage regulator 140. In FIG. 16, a plurality of bipolar transistors including the bipolar transistor 110 may be cascade-connected, as shown in FIGS. 12 and 14.

In the communication apparatus according to the present embodiment, a temperature compensation circuit is provided in the collector voltage generation section which supplies a voltage to the collector terminal of the bipolar transistor. The temperature compensation circuit compensates an application voltage according to temperature so as to obtain a desired output power at actual temperature. By this, output power variations with temperature in the saturation region of the bipolar transistor can be minimized.

While the invention has been described in detail, the foregoing description is in all aspects illustrative and not restrictive. It is understood that numerous other modifications and variations can be devised without departing from the scope of the invention.

What is claimed is:

1. A high-frequency power amplifier capable of minimizing a temperature dependence of an output power even in a saturation region of a bipolar transistor, the amplifier comprising:
    a bipolar transistor;
    a base bias circuit for applying a base voltage to the bipolar transistor; and
    a collector voltage generation section for applying a collector voltage to the bipolar transistor, wherein
    the collector voltage generation section includes a temperature compensation circuit for performing temperature compensation on a power control signal to be inputted,
    wherein the collector voltage generation section applies, as a collector offset voltage, a voltage having a difference between a reference collector voltage at which a desired collector current is obtained at a reference temperature and a collector voltage required to obtain the desired collector current at actual temperature, to the reference collector voltage.

2. The high-frequency power amplifier according to claim 1, wherein the temperature compensation circuit includes:

a temperature compensation voltage source; and an adder for adding an offset voltage to be outputted from the temperature compensation voltage source to the power control signal.

3. The high-frequency power amplifier according to claim 1, wherein the temperature compensation circuit includes:

a temperature compensation voltage source; and a subtractor for subtracting an offset voltage to be outputted from the temperature compensation voltage source from the power control signal.

4. The high-frequency power amplifier according to claim 1, wherein the collector voltage generation section includes a voltage regulator.

5. The high-frequency power amplifier according to claim 1, wherein the collector voltage generation section includes a DC/DC converter.

6. The high-frequency power amplifier according to claim 1, wherein the collector voltage generation section includes:

an operational amplifier; and a P-type field-effect transistor or a PNP bipolar transistor.

7. The high-frequency power amplifier according to claim 1, wherein the power control signal is an amplitude modulation signal.

8. The high-frequency power amplifier according to claim 1, wherein there are a plurality of the bipolar transistors, and the plurality of the bipolar transistors are connected in multiple stages.

9. A communication apparatus comprising:

a baseband circuit;

a converter for converting an output signal of the baseband circuit into an amplitude modulation signal and a phase modulation signal;

a collector voltage generation section including a temperature compensation circuit for performing temperature compensation on the amplitude modulation signal;

a voltage controlled oscillator for controlling an oscillatory frequency based on the phase modulation signal;

a bipolar transistor having a collector terminal and a base terminal, an output voltage of the collector voltage generation section being applied to the collector terminal and an output of the voltage controlled oscillator being inputted to the base terminal; and a base bias circuit for applying a base voltage to the bipolar transistor.

* * * * *